United States Patent
Kimura

(10) Patent No.: US 10,409,499 B2
(45) Date of Patent: Sep. 10, 2019

(54) NAND FLASH MEMORY DEVICE AND SYSTEM INCLUDING SLC AND MLC WRITE MODES

(71) Applicant: Toshiba Memory Corporation, Minato-ku (JP)

(72) Inventor: Keita Kimura, Fujisawa (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/916,551

(22) Filed: Mar. 9, 2018

(65) Prior Publication Data
US 2018/0267719 A1    Sep. 20, 2018

(30) Foreign Application Priority Data

Mar. 16, 2017 (JP) ................ 2017-051471

(51) Int. Cl.
| | |
|---|---|
| G06F 3/06 | (2006.01) |
| G06F 12/02 | (2006.01) |
| G11C 11/56 | (2006.01) |
| G11C 16/10 | (2006.01) |

(52) U.S. Cl.
CPC .......... *G06F 3/0614* (2013.01); *G06F 3/0629* (2013.01); *G06F 3/0679* (2013.01); *G06F 12/0246* (2013.01); *G11C 11/5635* (2013.01); *G11C 16/10* (2013.01); *G06F 2212/214* (2013.01); *G11C 2213/71* (2013.01)

(58) Field of Classification Search
None
See application file for complete search history.

(56) References Cited

U.S. PATENT DOCUMENTS

| | | |
|---|---|---|
| 2006/0039230 A1 | 2/2006 | Kurata et al. |
| 2006/0215450 A1 | 9/2006 | Honma et al. |
| 2007/0159886 A1 | 7/2007 | Kang |
| 2009/0267128 A1 | 10/2009 | Maejima |
| 2009/0268522 A1 | 10/2009 | Maejima |
| 2010/0207195 A1 | 8/2010 | Fukuzumi et al. |
| 2010/0214838 A1 | 8/2010 | Hishida et al. |
| 2011/0134697 A1* | 6/2011 | Zhao ............ G11C 11/5642 365/185.12 |

(Continued)

FOREIGN PATENT DOCUMENTS

| | | |
|---|---|---|
| JP | 2006-59481 | 3/2006 |
| JP | 4768298 | 9/2011 |

(Continued)

*Primary Examiner* — J. H. Hur
(74) *Attorney, Agent, or Firm* — Oblon, McClelland, Maier & Neustadt, L.L.P.

(57) ABSTRACT

According to one embodiment, a semiconductor memory device includes a memory string including first and second selection transistors, a first transistor, and first and second memory cell transistors, first and second selection gate lines, first to third word lines, and a row decoder. A write operation includes a first mode to write one-bit data and a second mode to write two-bit data. In a case of writing the one-bit data to the first memory cell transistor in the first mode, the row decoder applies a first voltage to the first word line. In a case of writing the two-bit data to the first memory cell transistor in the second mode, the row decoder applies, to the first word line, a second voltage that is higher than the first voltage.

20 Claims, 16 Drawing Sheets

(56) References Cited

U.S. PATENT DOCUMENTS

| | | |
|---|---|---|
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2012/0307561 A1 | 12/2012 | Joo et al. |
| 2013/0332659 A1 | 12/2013 | Maejima |

FOREIGN PATENT DOCUMENTS

| | | |
|---|---|---|
| JP | 2012-252775 | 12/2012 |
| JP | 2013-254537 | 12/2013 |
| JP | 5378650 | 12/2013 |

\* cited by examiner

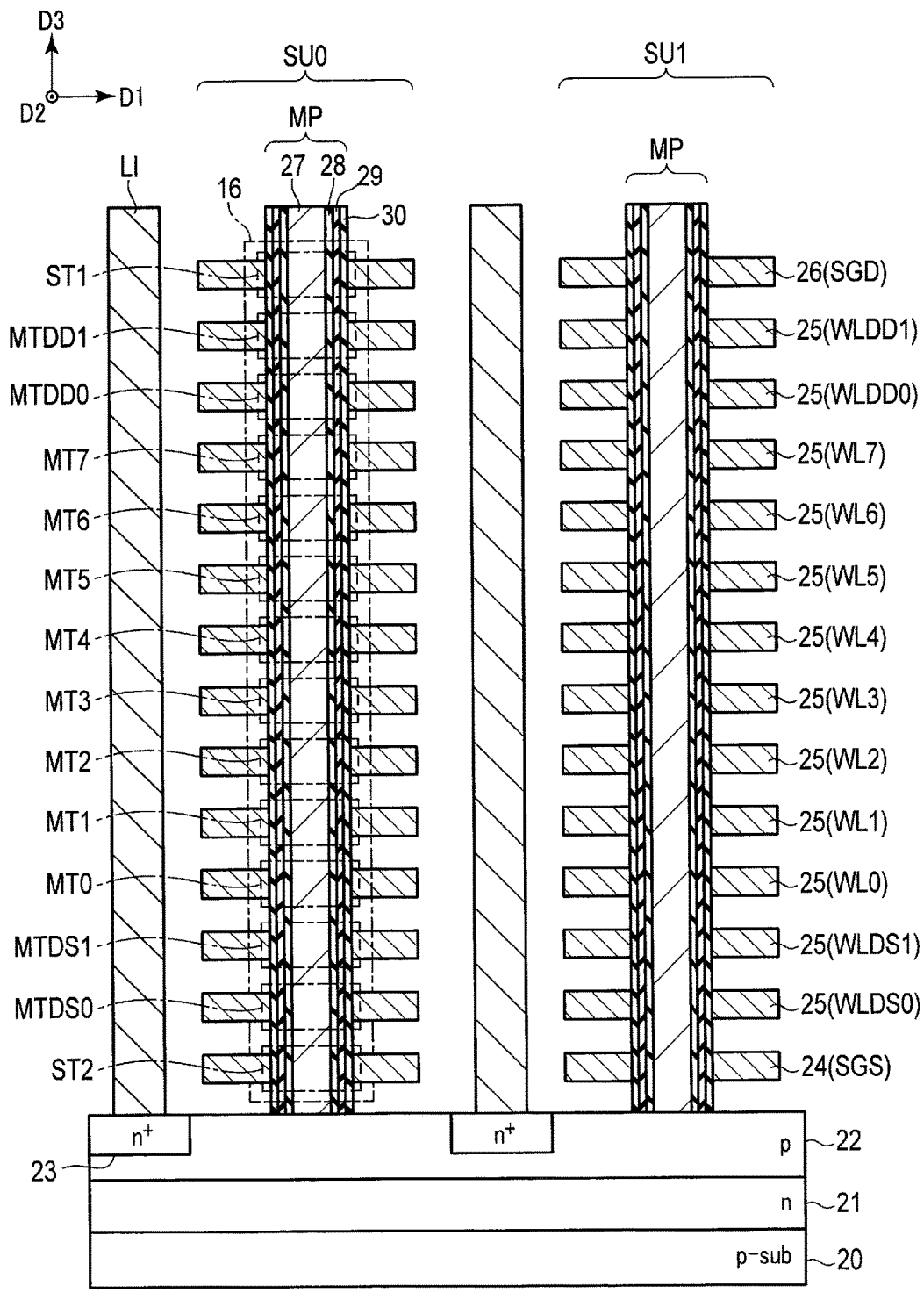
F I G. 4

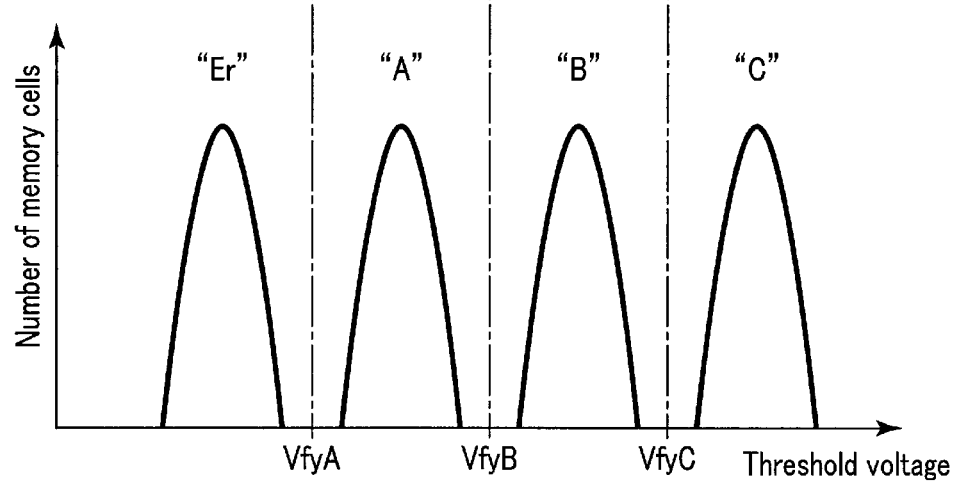
F I G. 5

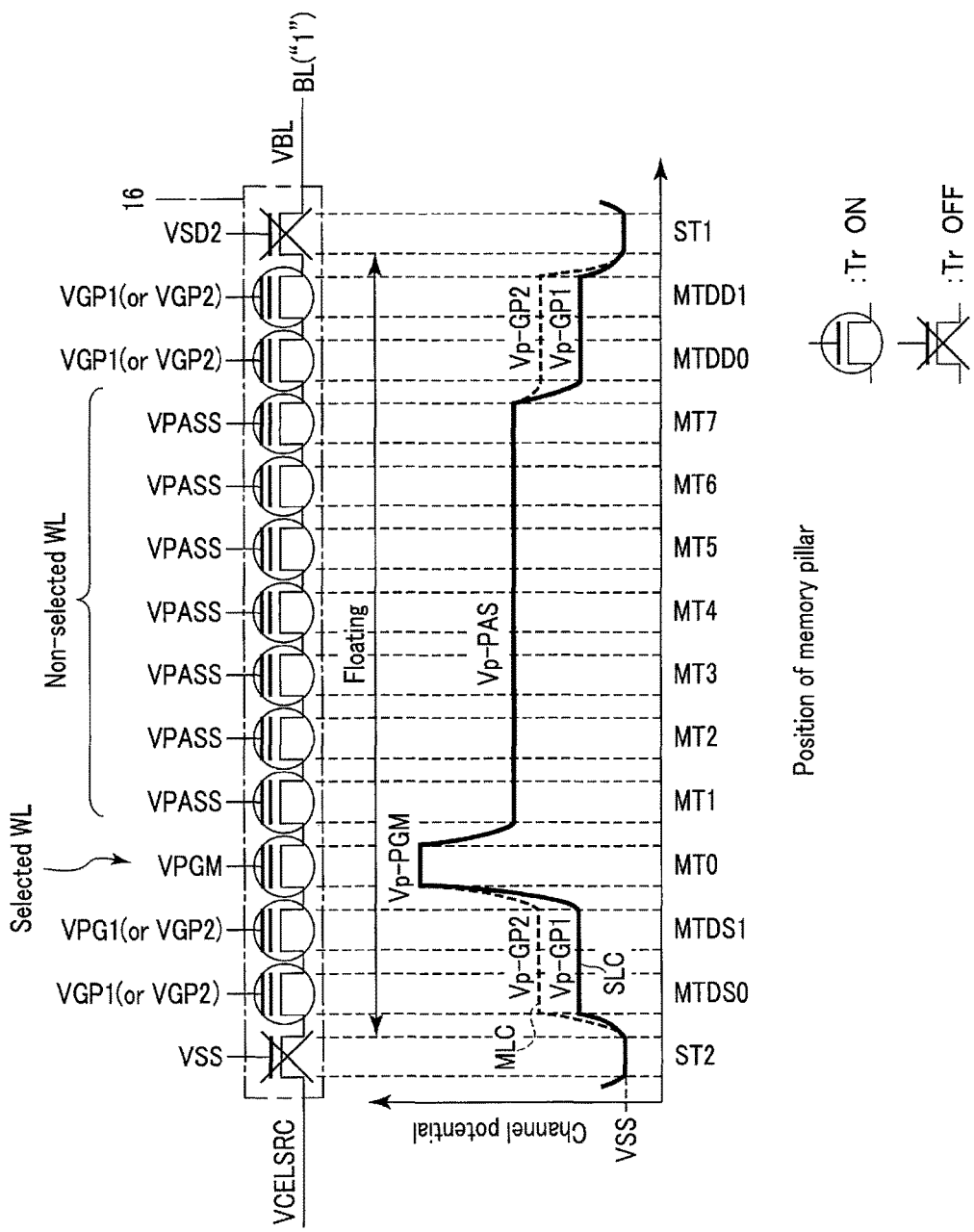
F I G. 10

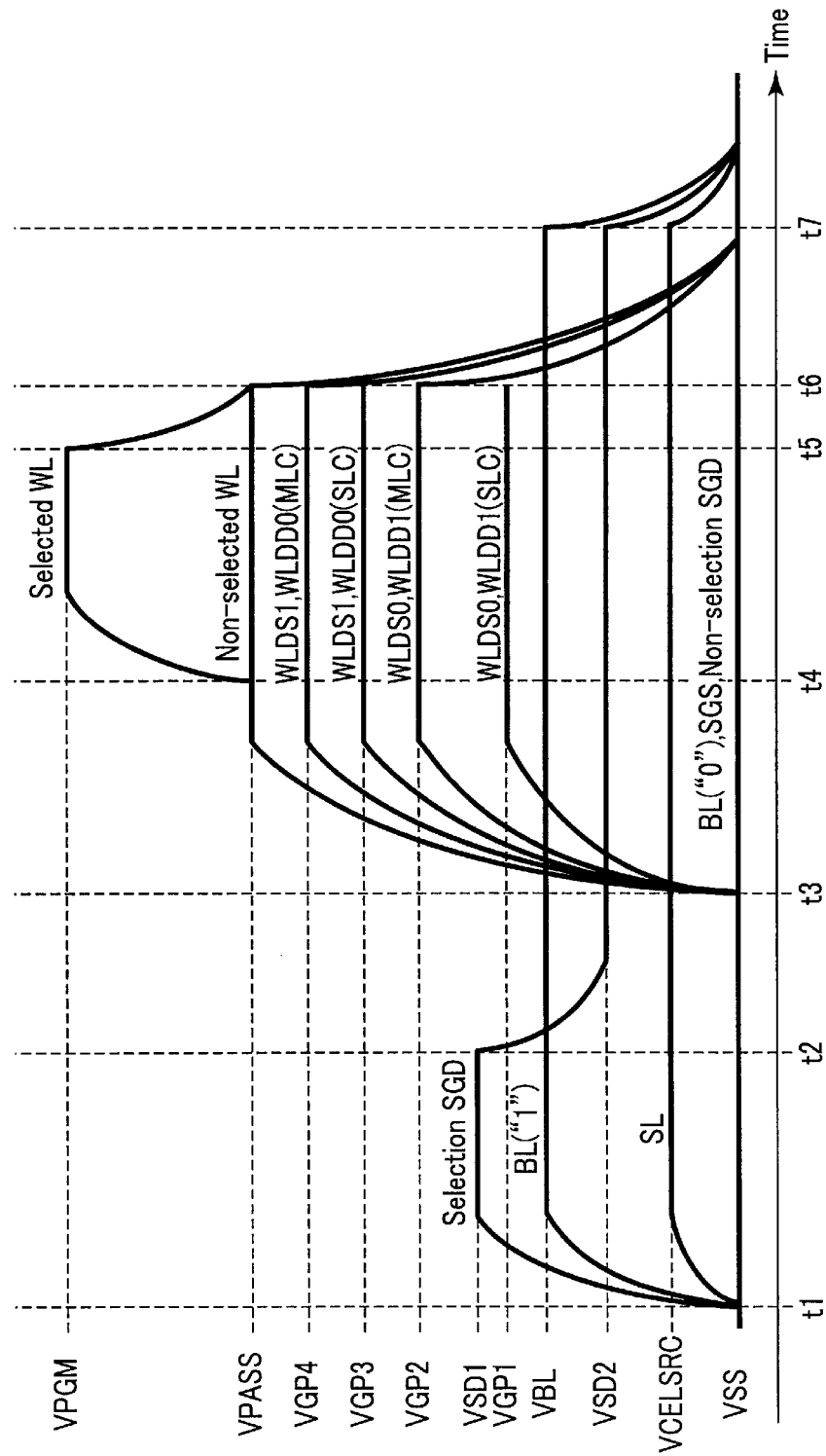
F I G. 12

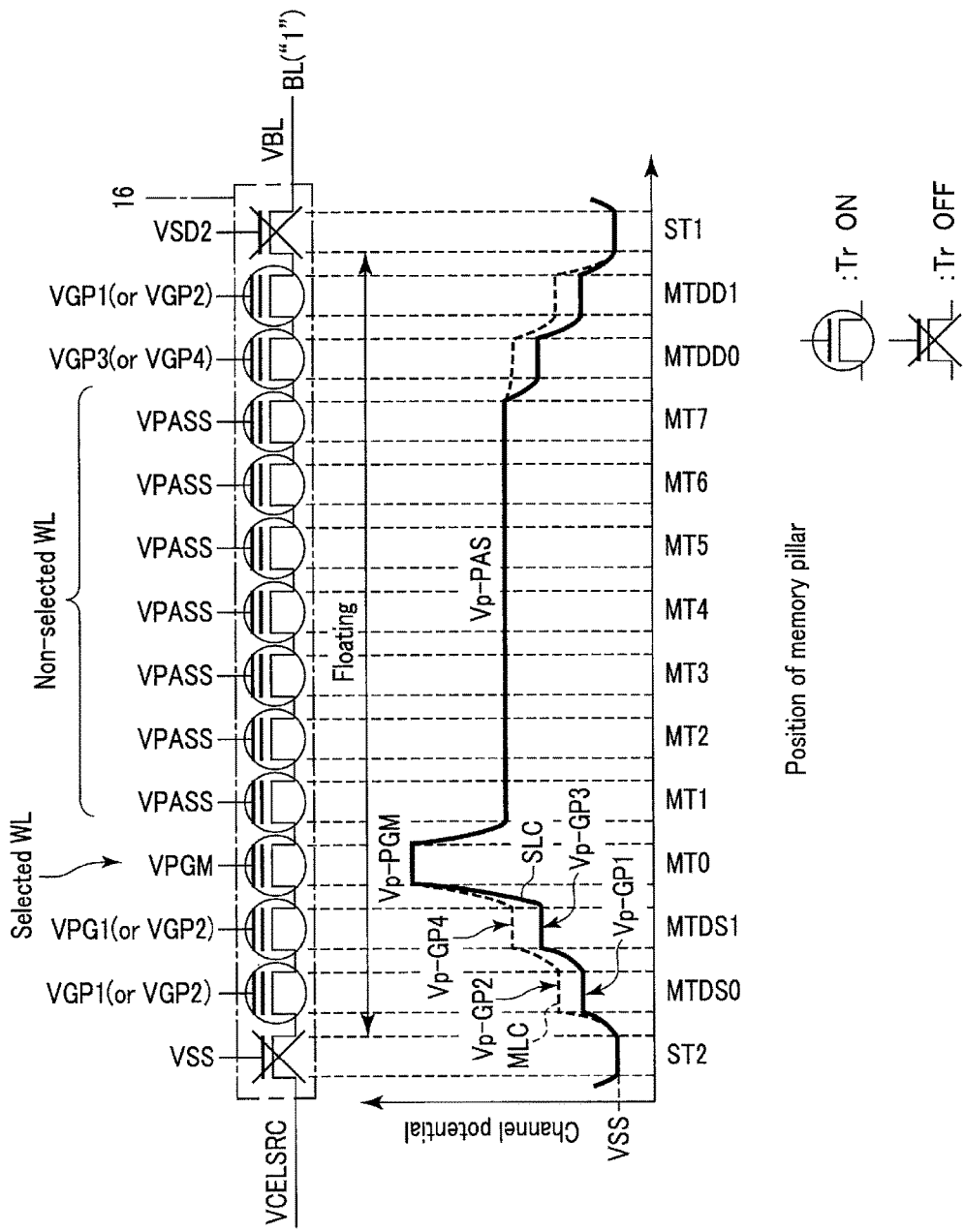
F I G. 13

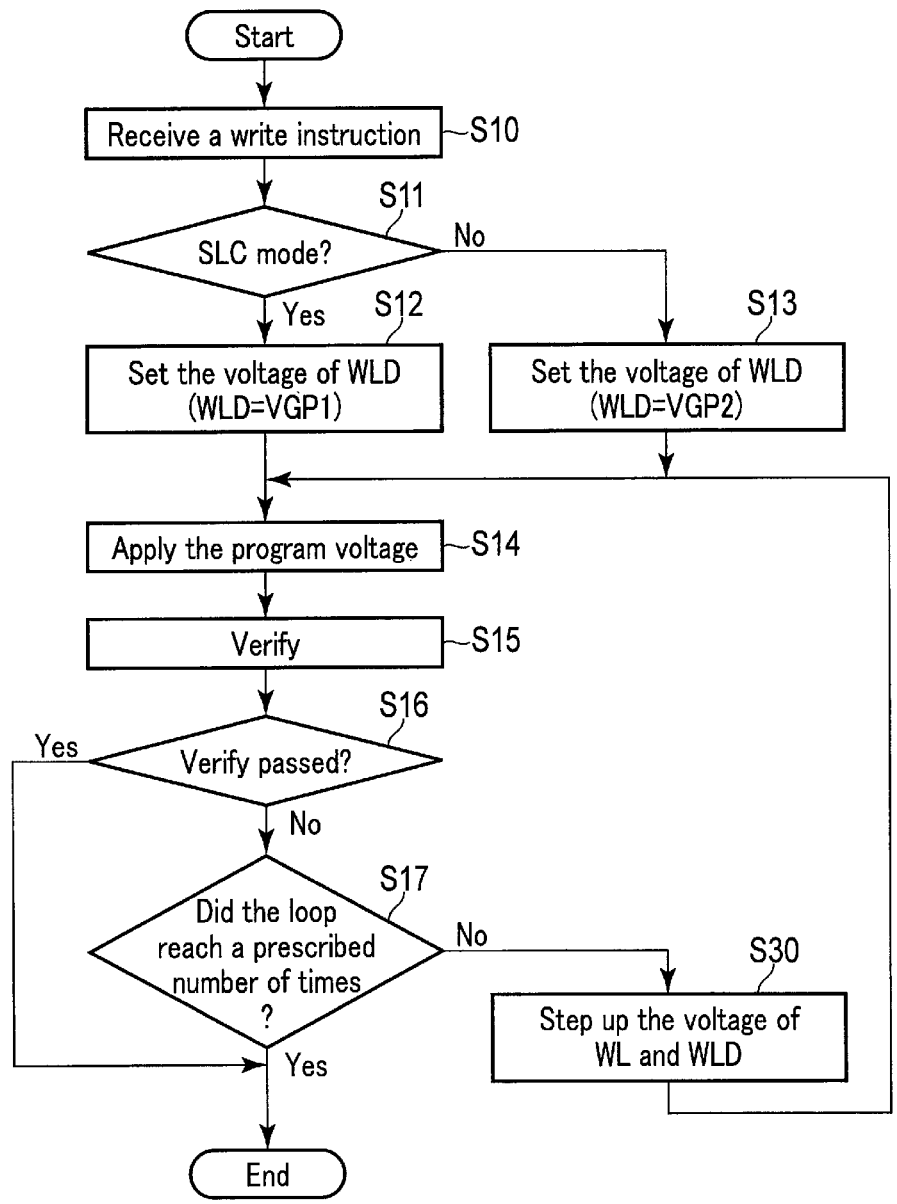
F I G. 14

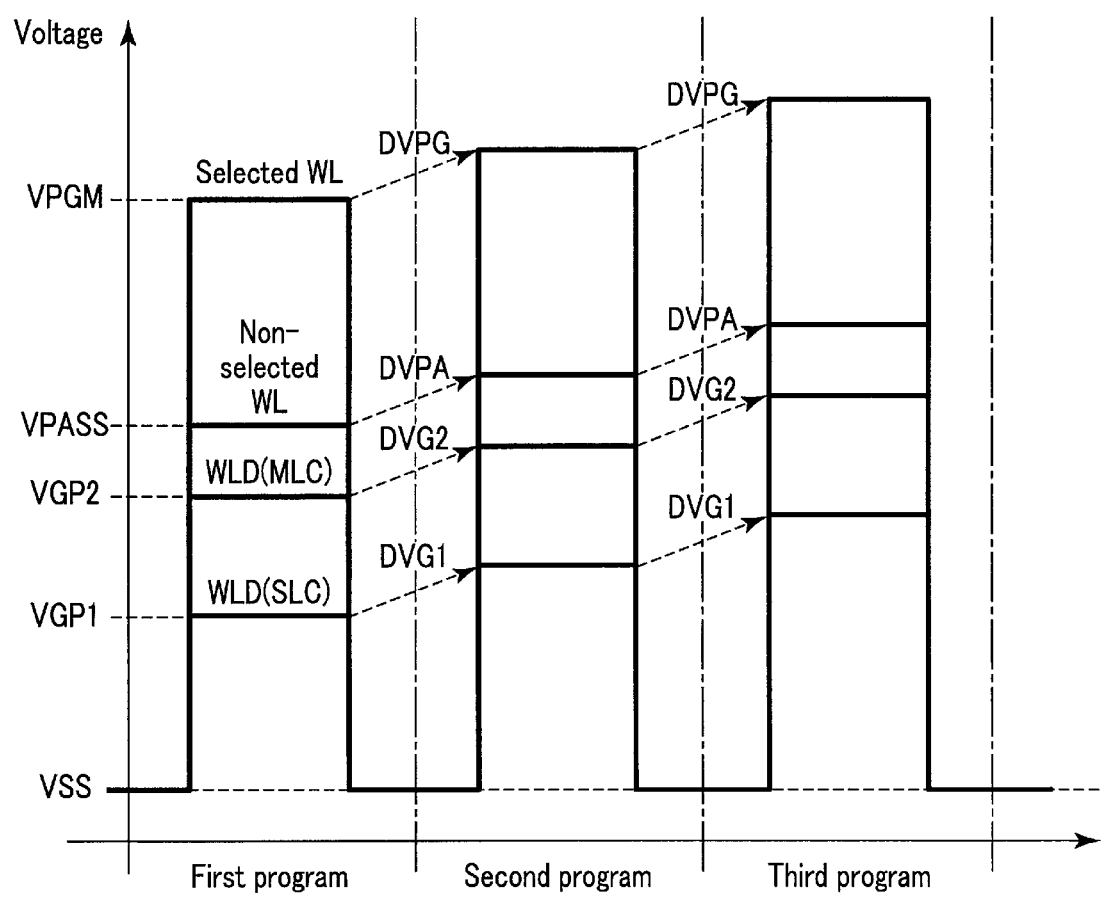
F I G. 15

US 10,409,499 B2

NAND FLASH MEMORY DEVICE AND SYSTEM INCLUDING SLC AND MLC WRITE MODES

CROSS-REFERENCE TO RELATED APPLICATIONS

This application is based upon and claims the benefit of priority from Japanese Patent Application No. 2017-051471, filed Mar. 16, 2017, the entire contents of which are incorporated herein by reference.

FIELD

Embodiments described herein relate generally to a semiconductor memory device and a memory system.

BACKGROUND

A NAND flash memory is known as a semiconductor memory device.

BRIEF DESCRIPTION OF THE DRAWINGS

FIG. 4 is a cross-sectional view of the memory cell array included in the semiconductor memory device according to the first embodiment;

FIG. 5 is a threshold distribution chart of a memory cell transistor included in the semiconductor memory device according to the first embodiment;

FIG. 10 is a diagram showing a channel potential of a NAND string corresponding to writing "1" of the semiconductor memory device according to the first embodiment;

FIG. 12 is a timing chart showing a voltage of each interconnect at a time of the write operation of the semiconductor memory device according to the second embodiment;

FIG. 13 is a diagram showing a channel potential of a NAND string corresponding to writing "1" of the semiconductor memory device according to the second embodiment;

FIG. 14 is a flowchart showing a write operation of a semiconductor memory device according to a third embodiment;

FIG. 15 is a timing chart showing a voltage of a word line and a dummy word line at a time of the write operation of the semiconductor memory device according to the third embodiment.

DETAILED DESCRIPTION

In general, according to one embodiment, a semiconductor memory device includes: a memory string including first and second selection transistors, a first transistor coupled to the first selection transistor, and first and second memory cell transistors coupled between the first transistor and the second selection transistor; first and second selection gate lines coupled respectively to gates of the first and second selection transistors; a first word line coupled to a gate of the first transistor; second and third word lines coupled respectively to gates of the first and second memory cell transistors; and a row decoder configured to apply a voltage to the first and second selection gate lines and the first to third word lines. A write operation includes a first mode to write one-bit data and a second mode to write two-bit data. In the case of writing one-bit data to the first memory cell transistor in the first mode, the row decoder applies a first voltage to the first word line. In the case of writing two-bit data to the first memory cell transistor in the second mode, the row decoder applies, to the first word line, a second voltage that is higher than the first voltage.

1. First Embodiment

The semiconductor memory device and the memory system according to the first embodiment will be described. Hereinafter, a three-dimensional stacked NAND flash memory in which a memory cell transistor is three-dimensionally stacked above a semiconductor substrate will be described as an example of the semiconductor memory device.

1.1. Configuration 1.1.1. Overall Configuration of the Memory System

First, an overall configuration of the memory system according to the present embodiment will be described with reference to FIG. 1.

Figure 1:
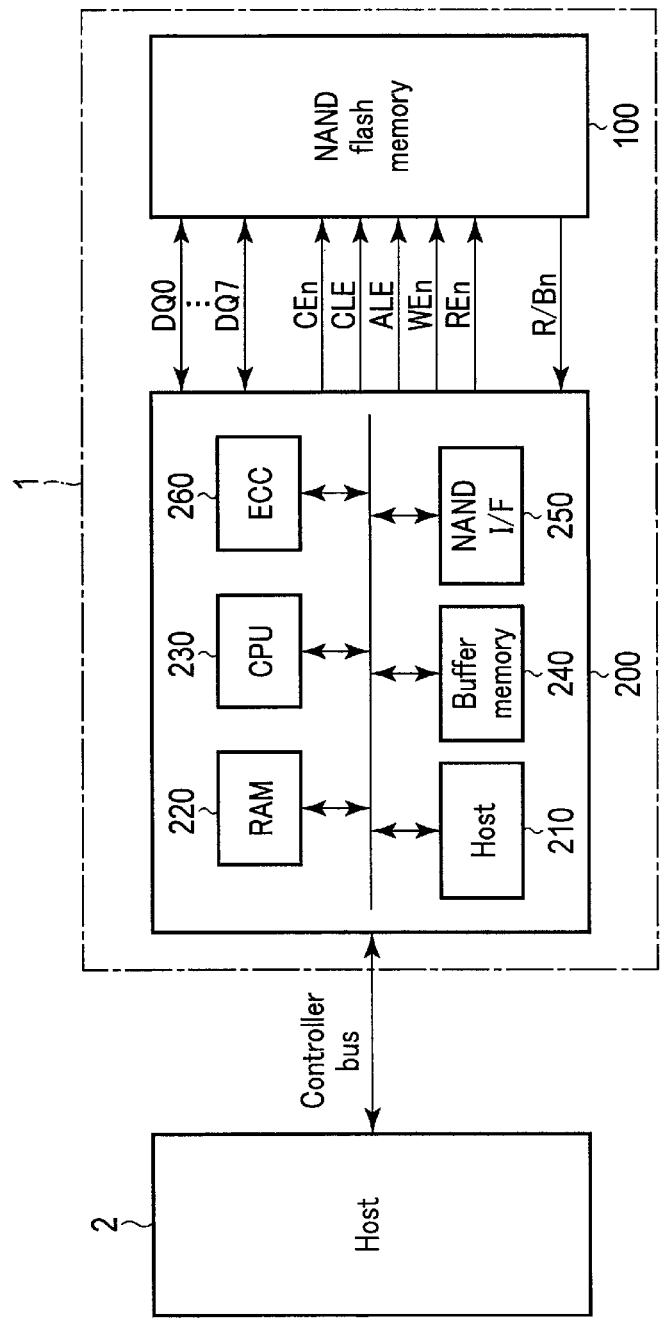
FIG. 1 is a block diagram of a memory system according to a first embodiment.

A memory system 1 includes a NAND flash memory 100 and a controller 200, as shown in FIG. 1. The controller 200 and the NAND flash memory 100, in combination for example, may form one semiconductor memory device, examples of which include a memory card, such as an SD™ card, and a solid state drive (SSD), or the like.

The NAND flash memory 100 includes a plurality of memory cell transistors, and stores data in a non-volatile form. The NAND flash memory 100 is coupled with the controller 200 by a NAND bus, and operates based on a command from the controller 200. More specifically, the NAND flash memory 100 transmits/receives, for example, an eight-bit input-output signal I/O to/from the controller 200 via data lines DQ0 to DQ7. The input-output signal I/O is, for example, data, address, and command. Also, the NAND flash memory 100 receives, from the controller 200, a chip enable signal CEn, a command latch enable signal CLE, an address latch enable signal ALE, a write enable signal WEn, and a read enable signal REn, for example. The NAND flash memory 100 transmits a ready/busy signal R/Bn to the controller 200.

The chip enable signal CEn is a signal to enable the NAND flash memory 100. The command latch enable signal CLE is a signal indicating that the input-output signal I/O is a command. The address latch enable signal ALE is a signal indicating that the input-output signal I/O is an address. The write enable signal WEn is a signal to import a received signal into the NAND flash memory 100. The read enable signal REn is a signal for the controller 200 to read data from the NAND flash memory 100. The ready/busy signal R/Bn is a signal indicating whether the NAND flash memory 100 is busy or not (whether the NAND flash memory 100 is incapable or capable of receiving a command from the controller 200).

The controller 200 commands the NAND flash memory 100 to, for example, read, write, and delete data in response to a command from a host device 2. The controller 200 also controls a memory space of the NAND flash memory 100.

The controller 200 includes a host interface circuit 210, an internal memory (RAM) 220, a processor (CPU) 230, a buffer memory 240, a NAND interface circuit 250, and an ECC circuit 260.

The host interface circuit 210 is coupled with the host device 2 via a controller bus, and controls communication with the host device 2. The host interface circuit 210 transfers, to the processor 230 and the buffer memory 240, a command and data received from the host device 2. The host interface circuit 210 also transfers data in the buffer memory 240 to the host device 2 in response to a command of the processor 230.

The NAND interface circuit 250 is coupled with the NAND flash memory 100 via a NAND bus, and controls communication with the NAND flash memory 100. The NAND interface circuit 250 transfers, to the NAND flash memory 100, a command received from the processor 230. The NAND interface circuit 250 transfers write data in the buffer memory 240 to the NAND flash memory 100 at a time of writing. Also, at a time of reading, the NAND interface circuit 250 transfers, to the buffer memory 240, data read from the NAND flash memory 100.

The processor 230 controls the entire operation of the controller 200. For example, upon receiving a write command from the host device 2, the processor 230 outputs the write command to the NAND flash memory 100 in response thereto. The same holds true of a time of reading and deleting. The processor 230 performs various kinds of processing for controlling the NAND flash memory 100, such as wear leveling. The processor 230 also performs various kinds of computations. For example, the processor 230 performs processing of encrypting data, processing of randomizing data, etc.

The ECC circuit 260 performs error checking and correcting (ECC) of data.

The internal memory 220 is a semiconductor memory, such as a DRAM, and is used as an operation area of the processor 230. The internal memory 220 holds firmware, various control tables, etc., for controlling the NAND flash memory 100.

1.1.2. Configuration of the Semiconductor Memory Device

Next, a configuration of the semiconductor memory device will be described with reference to FIG. 2.

Figure 2:
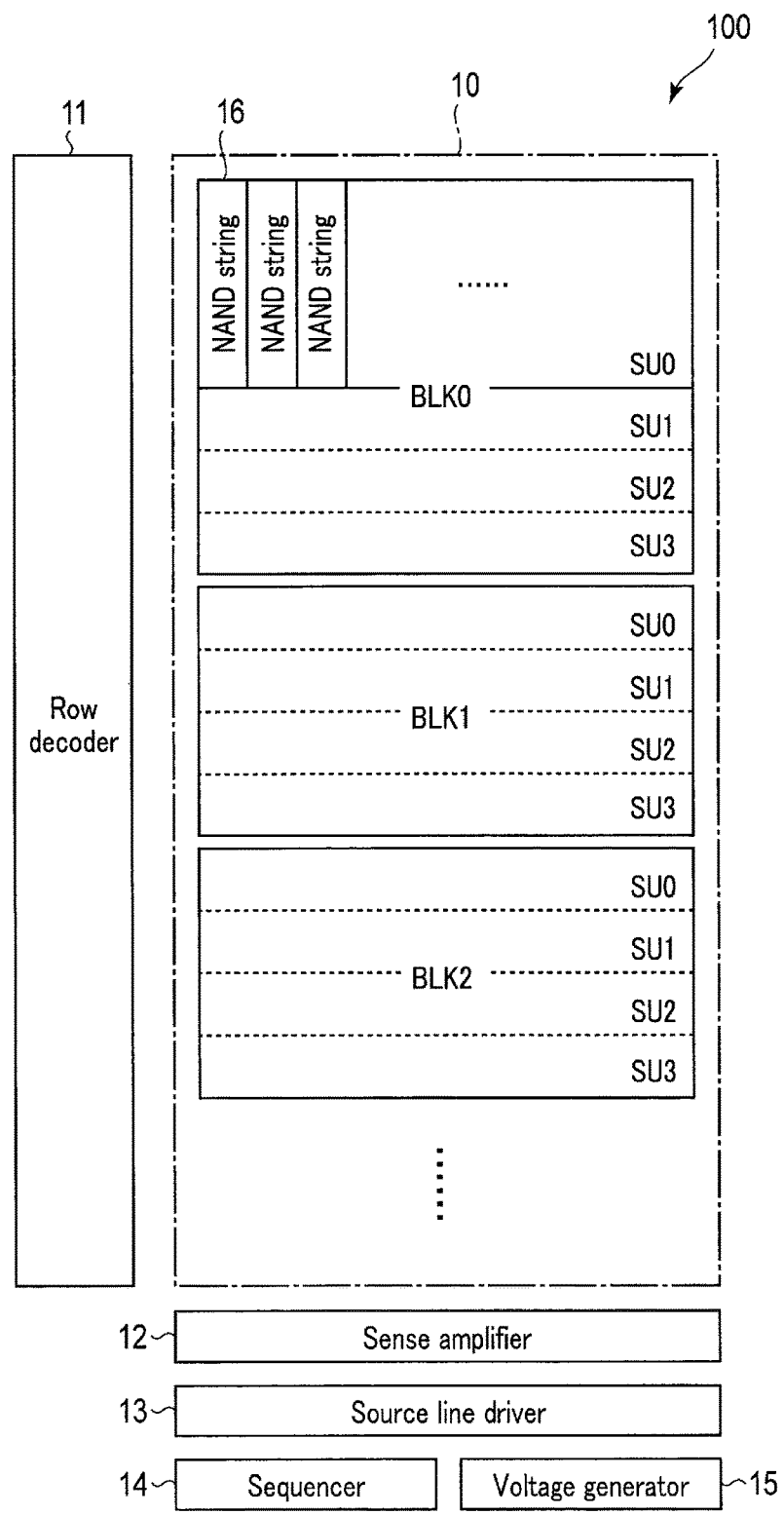
FIG. 2 is a block diagram of a semiconductor memory device according to the first embodiment.

The NAND flash memory 100 includes a memory cell array 10, a row decoder 11, a sense amplifier 12, a source line driver 13, a sequencer 14, and a voltage generator 15, as shown in FIG. 2.

The memory cell array 10 includes a plurality of blocks BLK (BLK0, BLK1, BLK2, . . . ), each of which includes a non-volatile memory cell transistor (hereinafter also referred to as "memory cell") corresponding to a row and column. Each of the blocks BLK includes, for example, four string units SU (SU0 to SU3). Each of the string units SU includes a plurality of NAND strings 16. The number of blocks BLK in the memory cell array 10 and the number of string units SU in the block BLK are discretionary. The memory cell array 10 will be detailed later.

The row decoder 11 decodes a row address provided from the controller 200. The row decoder 11 selects one of the blocks BLK and further selects one of the string units SU based on a result of decoding. Then, the row decoder 11 outputs a necessary voltage to the block BLK.

The sense amplifier 12 senses data read from the memory cell array 10 at a time of reading data. Then, the sense amplifier 12 outputs the read data to the controller 200. At a time of writing data, the sense amplifier 12 transfers, to the memory cell array 10, write data received from the controller 200.

The source line driver 13 applies a necessary voltage to a source line at a time of writing, reading, and deleting.

The sequencer 14 controls the entire operation of the NAND flash memory 100.

The voltage generator 15 generates a voltage necessary to write, read, and delete data according to the control of the sequencer 14, and applies the generated voltage to the row decoder 11, the sense amplifier 12, the source line driver 13, etc. The row decoder 11, the sense amplifier 12, and the source line driver 13 apply the voltage supplied by the voltage generator 15, to the memory cell transistor in the memory cell array 10.

1.1.3. Configuration of the Memory Cell Array

Next, the configuration of the memory cell array 10 will be described with reference to FIG. 3. The example in FIG. 3 shows the block BLK0, but the other blocks BLK also have the same configuration.

Figure 3:
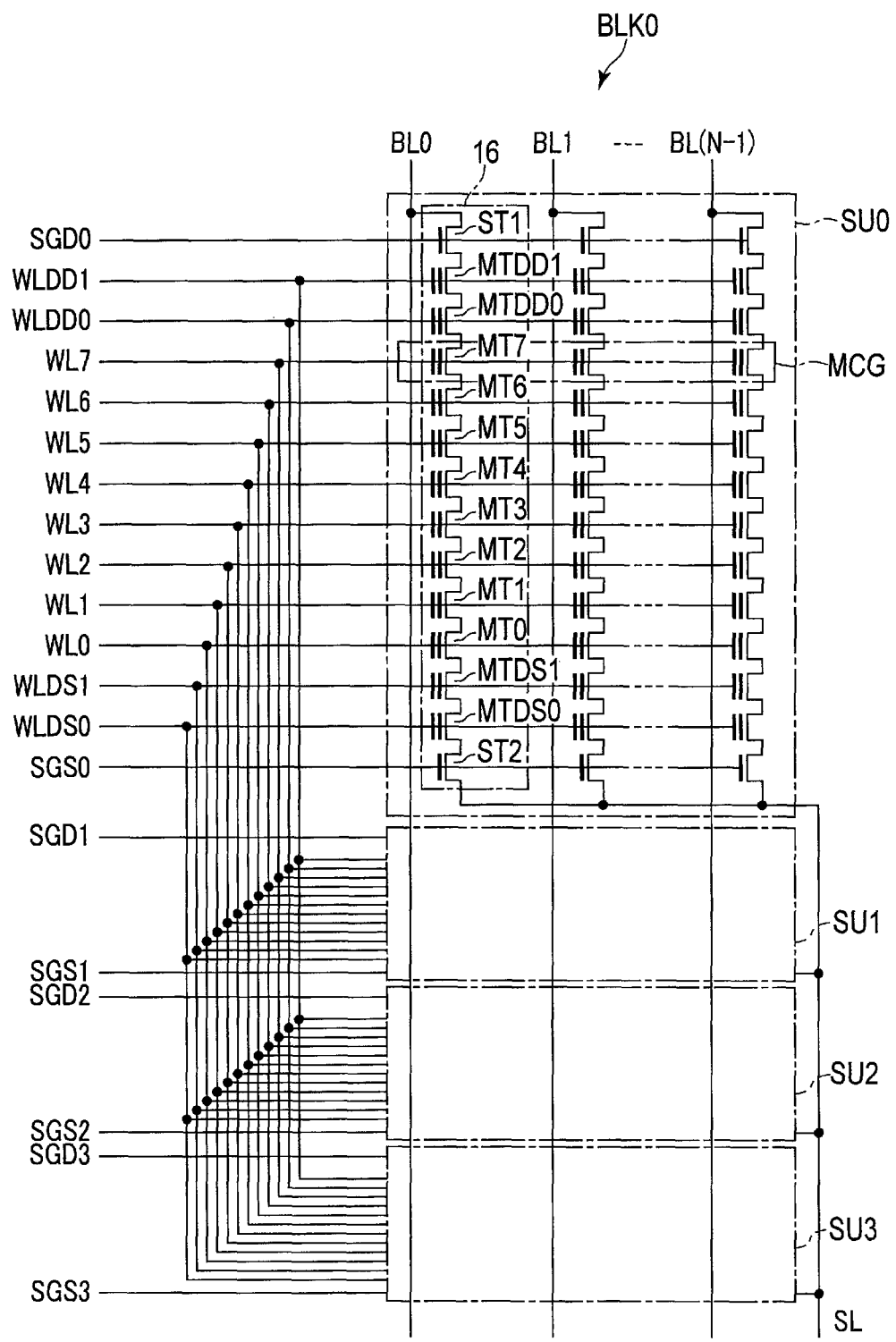
FIG. 3 is a circuit diagram of a memory cell array included in the semiconductor memory device according to the first embodiment.

The block BLK0 includes, for example, four string units SU (SU0 to SU3), as shown in FIG. 3. Each of the string units SU includes a plurality of NAND strings 16. Each of the NAND strings 16 includes, for example, eight memory cell transistors MT0 to MT7, four dummy memory cell transistors MTDS0, MTDS1, MTDD0, and MTDD1, and selection transistors ST1 and ST2. Hereinafter, in the case of not specifying the memory cell transistors MT0 to MT7, the memory cell transistors are indicated as a memory cell transistor MT. In the case of not specifying the dummy memory cell transistors MTDS0 and MTDS1 provided between the selection transistor ST2 and the memory cell transistor MT0, the dummy memory cell transistors are indicated as a dummy memory cell transistor MTDS. In the case of not specifying the dummy memory cell transistors MTDD0 and MTDD1 provided between the memory cell transistor MT7 and the selection transistor ST1, the dummy memory cell transistors are indicated as a dummy memory cell transistor MTDD. Furthermore, in the case of not specifying the dummy memory cell transistors MTDS and MTDD, the dummy memory cell transistors are indicated as a dummy memory cell transistor MTD. The memory cell transistor MT and the dummy memory cell transistor MTD include a control gate and a charge storage layer. The memory cell transistor MT holds data in a non-volatile form. The dummy memory cell transistor MTD has the same configuration as the memory cell transistor MT, but is used as a dummy and not used to hold data.

The memory cell transistor MT and the dummy memory cell transistor MTD may be a MONOS type that uses an insulation film for the charge storage layer, or may be an FG type that uses a conductive layer for the charge storage layer. In the present embodiment, a MONOS-type memory cell transistor and dummy memory cell transistor will be described as an example. The number of memory cell transistors MT is not limited to eight, and may be 16, 32, 64, 128, etc. The number thereof is unlimited. Also, the number of dummy memory cell transistors MTD and selection transistors ST1 and ST2 may be determined discretionarily, as long as there is one or more dummy memory cell transistors and one or more selection transistors.

The memory cell transistors MT and the dummy memory cell transistors MTD are coupled in series between the source of the selection transistor ST1 and the drain of the selection transistor ST2. More specifically, the current pathways of the dummy memory cell transistors MTDS0 and MTDS1, the memory cell transistors MT0 to MT7, and the dummy memory cell transistors MTDD0 and MTDD1 are coupled in series. The drain of the dummy memory cell transistor MTDD1 is coupled to the source of the selection transistor ST1, and the source of the dummy memory cell transistor MTDS0 is coupled to the drain of the selection transistor ST2.

The gates of the selection transistors ST1 in the respective string units SU0 to SU3 are respectively coupled to selection gate lines SGD0 to SGD3. Likewise, the gates of the selection transistors ST2 in the respective string units SU0 to SU3 are respectively coupled to selection gate lines SGS0 to SGS3. Hereinafter, in the case of not specifying the selection gate lines SGD0 to SGD3, the selection gate lines are indicated as a selection gate line SGD. In the case of not specifying the selection gate lines SGS0 to SGS3, the selection gate lines are indicated as a selection gate line SGS. The selection gate lines SGS0 to SGS3 of the respective string units SU may be commonly coupled.

The control gates of the memory cell transistors MT0 to MT7 in the block BLK are commonly coupled to the word lines WL0 to WL7, respectively. Likewise, the control gates of the dummy memory cell transistors MTDS0, MTDS1, MTDD0, and MTDD1 in the block BLK are commonly coupled to the dummy word lines WLDS0, WLDS1, WLDD0, and WLDD1, respectively. Hereinafter, in the case of not specifying the word lines WL0 to WL7, the word lines are indicated as a word line WL. In the case of not specifying the dummy word lines WLDS0 and WLDS1, the dummy word lines are indicated as a dummy word line WLDS. In the case of not specifying the dummy word lines WLDD0 and WLDD1, the dummy word lines are indicated as a dummy word line WLDD. Also, in the case of not specifying the dummy word lines WLDS and WLDD, the dummy word lines are indicated as a dummy word line WLD.

The drains of the selection transistors ST1 of the respective NAND strings 16 in the string unit SU are respectively coupled to different bit lines BL0 to BL(N−1) (N being an integer of two or more). Hereinafter, in the case of not specifying the bit lines BL0 to BL(N−1), the bit lines are indicated as a bit line BL. Each bit line BL commonly couples one NAND string 16 in the respective string units SU of the blocks BLK. Also, the sources of the plurality of selection transistors ST2 are commonly coupled to a source line SL. Namely, the string unit SU is a collection of the NAND strings 16 that are coupled to different bit lines BL and are coupled to the same selection gate lines SGD and SGS. Also, the block BLK is a collection of the plurality of string units SU that share the word lines WL. The memory cell array 10 is a collection of the plurality of blocks BLK that share the bit lines BL.

The operation of writing data and the operation of reading data are performed at once on the memory cell transistor MT coupled to one of the word lines WL in one of the string units SU. Hereinafter, a group of memory cell transistors MT, that are collectively selected when performing the operation of writing data and the operation of reading data, is called a "memory cell group MCG." Also, a collection of one-bit data written to or read from one memory cell group MCG is called a "page."

Deletion of data can be performed per block BLK or at a unit smaller than a block BLK. A deleting method is described, for example, in an application under U.S. patent application Ser. No. 13/235,389 filed on Sep. 18, 2011 and entitled "NONVOLATILE SEMICONDUCTOR MEMORY DEVICE," The method is also described in an application under U.S. patent application Ser. No. 12/694,690 filed on Jan. 27, 2010 and entitled "NON-VOLATILE SEMICONDUCTOR STORAGE DEVICE," and in an application under U.S. patent application Ser. No. 13/483,610 filed on May 30, 2012 and entitled "NONVOLATILE SEMICONDUCTOR MEMORY DEVICE AND DATA ERASE METHOD THEREOF." The entire contents of these applications are incorporated herein by reference.

In addition, the memory cell array 10 may have a different configuration. Namely, the configuration of the memory cell array 10 is described, for example, in an application under U.S. patent application Ser. No. 12/407,403 filed on Mar. 19, 2009 and entitled "THREE DIMENSIONAL STACKED NONVOLATILE SEMICONDUCTOR MEMORY." The configuration of the memory cell array 10 is also described in an application under U.S. patent application Ser. No. 12/406,524 filed on Mar. 18, 2009 and entitled "THREE DIMENSIONAL STACKED NONVOLATILE SEMICONDUCTOR MEMORY", in an application under U.S. patent application Ser. No. 12/679,991 filed on Mar. 25, 2010 and entitled "NON-VOLATILE SEMICONDUCTOR STORAGE DEVICE AND METHOD OF MANUFACTURING THE SAME", and in an application under U.S. patent application Ser. No. 12/532,030 filed on Mar. 23, 2009 and entitled "SEMICONDUCTOR MEMORY AND METHOD FOR MANUFACTURING SAME". The entire contents of these applications are incorporated herein by reference.

1.1.4. Cross-Sectional Configuration of the Memory Cell Array

Next, the cross-sectional configuration of the memory cell array will be described with reference to FIG. 4. The example in FIG. 4 shows a cross section of the string units SU0 and SU1. The string units SU2 and SU3 also have the same configuration. In FIG. 4, an interlayer insulation film is omitted.

As shown in FIG. 4, a plurality of source line contacts LI are arranged along a first direction D1 parallel to the semiconductor substrate 20, and one string unit SU is disposed between two source line contacts LI. The source line contact LI couples the semiconductor substrate 20 and a source line SL (not shown in the figure) that is provided above the NAND string 16. The arrangement of the source line contact LI and the NAND string 16 may be discretionarily set. For example, a plurality of NAND strings 16 may be arranged between two source line contacts LI. To simplify the description, the example in FIG. 4 shows the case where the plurality of NAND strings 16 are arranged in a line along a second direction D2 perpendicular to the first direction D1 and parallel to the semiconductor substrate, in one string unit SU. However, the arrangement of the NAND strings 16 in one string unit SU may be discretionarily set.

For example, the NAND strings 16 may be arranged in two lines in parallel along the second direction D2, or may be staggered in four lines.

In each string unit SU, the NAND strings 16 are formed along a third direction D3 perpendicular to the semiconductor substrate 20. More specifically, an n-type well 21 is provided on a surface region of the semiconductor substrate 20. A p-type well 22 is provided on a surface region of the n-type well 21. An n+-type diffusion layer 23 is provided on a surface region of the p-type well 22. An interconnect layer 24 functioning as the selection gate line SGS, twelve interconnect layers 25 functioning as the dummy word lines WLD and the word lines WL, and an interconnect layer 26 functioning as the selection gate line SGD are sequentially stacked above the p-type well 22, with an interlayer insulation film (not shown in the figure) interposed between the respective layers.

Also, a pillar-shaped semiconductor layer 27 that reaches the p-type well 22 through the interconnect layers 26, 25, and 24 is formed. A tunnel insulation film 28, a charge storage layer 29, and a block insulation film 30 that functions as the control gate are sequentially formed on a side surface of the semiconductor layer 27. Polycrystalline silicon, for example, is used for the semiconductor layer 27. A silicon dioxide film, for example, is used for the tunnel insulation film 28 and the block insulation film 30. A silicon nitride film, for example, is used for the charge storage layer 29. Hereinafter, a pillar formed of the semiconductor layer 27, the tunnel insulation film 28, the charge storage layer 29, and the block insulation film 30 is called a "memory pillar MP." The semiconductor layer 27 functions as the current pathway of the NAND strings 16 and serves as a region where a channel of each transistor is formed. An upper end of the semiconductor layer 27 is coupled to an interconnect layer (not shown in the figure) that functions as the bit line BL.

The memory pillar MP and the interconnect layer 25 form the memory cell transistors MT and the dummy memory cell transistors MTD. Also, the memory pillar MP and the interconnect layer 26 form the selection transistor ST1, and the memory pillar MP and the interconnect layer 24 form the selection transistor ST2. In the example shown in FIG. 4, one interconnect layer 24 and one interconnect layer 26 are provided, but a plurality of interconnect layers 24 and 26 may be provided.

The source line contact LI has a line shape along the second direction D2. Polycrystalline silicon, for example, is used for the source line contact LI. A bottom surface of the source line contact LI is coupled to the n+-type diffusion layer 23, and an upper surface of the source line contact LI is coupled to an interconnect layer (not shown in the figure) that functions as the source line SL.

1.2. Threshold Distribution of the Memory Cell Transistor

Next, a threshold distribution that may be taken by the memory cell transistors MT according to the present embodiment will be described with reference to FIG. 5. The example in FIG. 5 shows a threshold distribution formed when the memory cell transistor MT holds four-value (two-bit) data. In the present embodiment, a case where the memory cell transistor MT can hold two-value (one-bit) or four-value (two-bit) data will be described below, but the data that can be held is not limited to two-value or four-value data. In the present embodiment, the memory cell transistor MT may hold data of eight-value (three-bit) or more, for example. Hereinafter, the memory cell transistor MT that holds one-bit data is called SLC, the memory cell transistor MT that holds two-bit data is called MLC, and the memory cell transistor MT that holds three-bit data is called TLC.

As shown in FIG. 5, a threshold voltage of each memory cell transistor MT takes a discrete value that is included in one of four distributions, for example. These four distributions are respectively called an "Er" level, "A" level, "B" level, and "C" level in ascending order of the threshold.

The "Er" level corresponds to, for example, a state in which data is deleted. A threshold voltage included in the "Er" level is smaller than a voltage VfyA, and has a positive or negative value.

The "A" to "C" levels correspond to a state in which an electrical charge is injected into the charge storage layer and data is written, and a threshold voltage included in each distribution has a positive value, for example. A threshold voltage included in the "A" level is equal to or greater than the voltage VfyA, and is less than a voltage VfyB (VfyB>VfyA). A threshold voltage included in the "B" level is equal to or greater than the voltage VfyB, and is less than a voltage VfyC (VfyC>VfyB). A threshold voltage included in the "C" level is equal to or greater than the voltage VfyC, and is less than voltages VREAD and VPASS (VREAD (or VPASS)>VfyC). VREAD and VPASS are voltages applied to a non-selected word line WL at the time of reading data and at the time of writing data, respectively.

Each memory cell transistor MT can take four types of states by having one of the four threshold distributions, as described above. Each memory cell transistor MT can hold two-bit data by allocating these states to "00" to "11" in binary number representation. Hereafter, the two-bit data is called an upper bit and lower bit. Also, a collection of upper bits collectively written (or read) in the memory cell group MCG is called an upper page, and a collection of lower bits collectively written (or read) in the memory cell group MCG is called a lower page.

In FIG. 5, the case where four levels are discretely distributed is shown as an example, but this is an ideal state realized immediately after writing data, for example. Therefore, in reality, the levels adjacent to each other may overlap each other. For example, after writing data, an upper end of the "Er" level and a lower end of the "A" level may overlap each other by disturbance, etc. In such a case, the data is corrected by the ECC technique, etc.

1.3. Write Operation

Next, the write operation will be described. The write operation roughly includes a program operation and a verify operation. By repeating combining the program operation and the verify operation (hereinafter called a "program loop"), the threshold voltage of the memory cell transistor MT is increased to a target level.

The program operation refers to an operation of increasing the threshold voltage by injecting an electron into the charge storage layer (or maintaining the threshold voltage by prohibiting the injection). Hereinafter, the operation of increasing the threshold voltage is called a "'0' write." On the other hand, the operation of maintaining the threshold voltage is called a "'1' write" or "write inhibit." More specifically, the voltage of the bit lines BL differs between the "0" write and the "1" write. For example, a voltage VSS is applied to the bit line BL corresponding to the "0" write condition. A voltage VBL (>VSS) is applied to the bit line BL corresponding to the "1" write. Hereinafter, the bit line corresponding to the "0" write is indicated as BL ("0"), and the bit line corresponding to the "1" write is indicated as BL ("1").

The program operation of the present embodiment includes two program modes, which are an SLC write mode to write one-bit data to the memory cell group MCG (hereinafter referred to as "SLC mode"), and an MLC write mode to write two-bit data to the memory cell group MCG (hereinafter referred to as "MLC mode"). The sequencer 14 selects a program mode according to the write command from the controller 200, for example. The voltage applied to the dummy word lines WLD at the time of the program operation differs between the SLC mode and the MLC mode of the present embodiment.

The verify operation is an operation of, after the program operation, reading data and determining whether the threshold voltage of the memory cell transistors MT reaches a target level. Hereinafter, a case where the threshold voltage of the memory cell transistors MT reaches a target level is referred to as "verify operation passed," and a case where the threshold voltage of the memory cell transistors MT does not reach a target level is referred to as "verify operation failed."

1.3.1. Overall Flow of the Write Operation of the Memory System

First, the overall flow of the write operation of the memory system 1 will be described with reference to FIG. 6.

Figure 6:
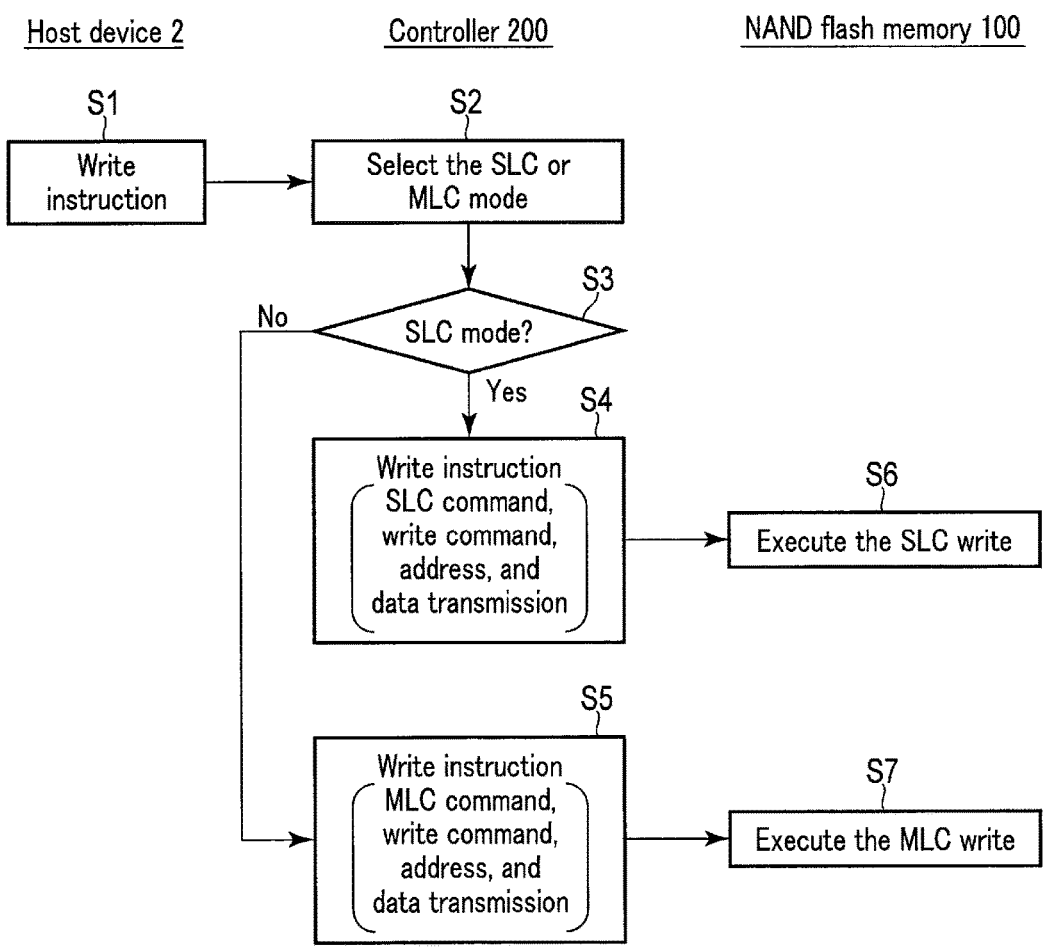
FIG. 6 is a flowchart showing a write operation of the memory system according to the first embodiment.

As shown in FIG. 6, the controller 200 first receives a write instruction from the host device 2 (step S1).

The processor 230 of the controller 200 selects the SLC mode or the MLC mode according to the write instruction (step S2). For example, if the write data is control information data, such as a log file indicating a state of the middle of the operation of the host device 2, the amount of the data often falls within one page. For such data, the processor 230 selects the SLC mode.

If selecting the SLC mode (step S3_Yes), the processor 230 issues an SLC command that commands execution of the SLC mode and a write command. The processor 230 transmits a write instruction (SLC command, write command, address, and data) to the NAND flash memory 100 via the NAND interface circuit 250 (step S4).

Then, the sequencer 14 selects the SLC mode and starts the write operation based on the write instruction received from the controller 200 (step S6).

If the SLC mode is not selected (step S3_No), namely, if selecting the MLC mode, the processor 230 issues an MLC command that commands execution of the MLC mode and a write command. The processor 230 transmits a write instruction (MLC command, write command, address, and data) to the NAND flash memory 100 via the NAND interface circuit 250 (step S5).

Then, the sequencer 14 selects the MLC mode and starts the write operation based on the write instruction received from the controller 200 (step S7).

1.3.2. Overall Flow of the Write Operation of the Semiconductor Memory Device

Next, the overall flow of the write operation of the semiconductor memory device will be described with reference to FIG. 7.

Figure 7:
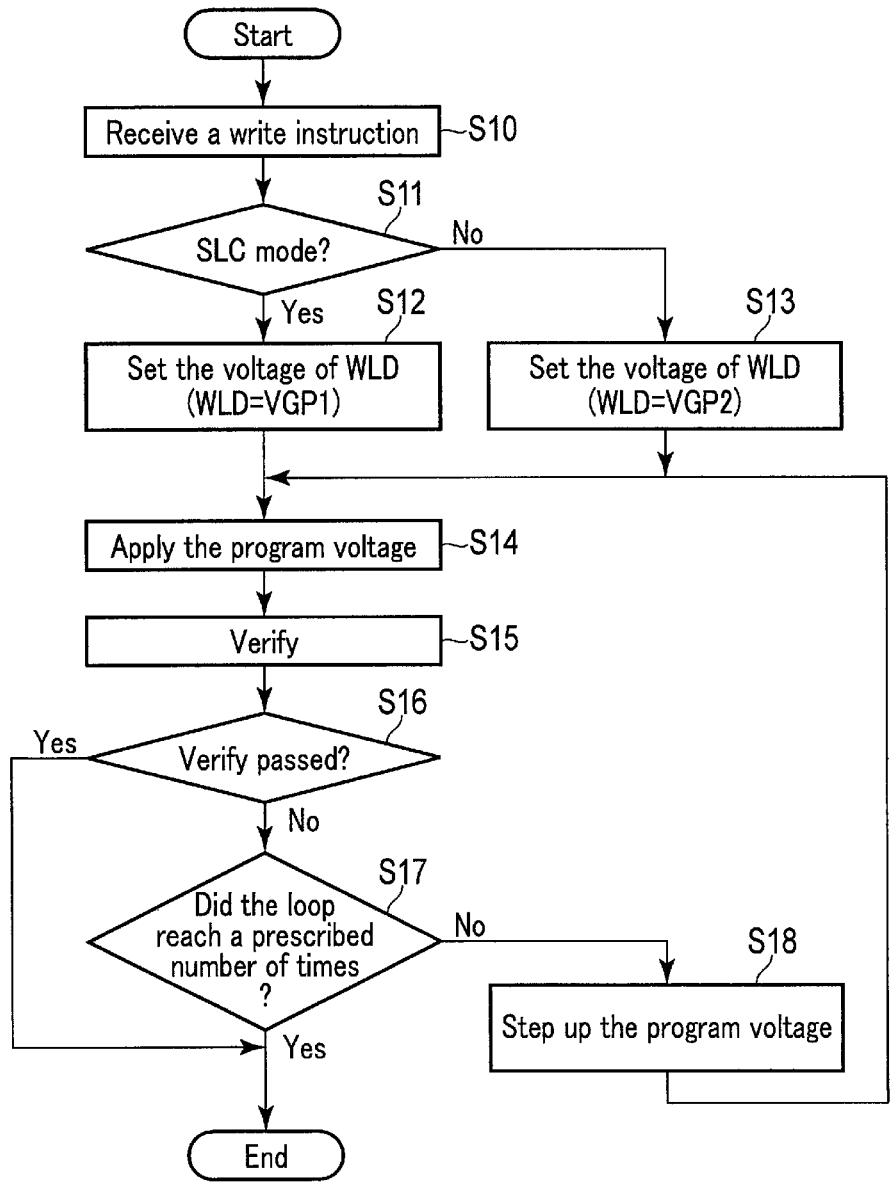
FIG. 7 is a flowchart showing a write operation of the semiconductor memory device according to the first embodiment.

First, the NAND flash memory 100 receives a write instruction from the controller 200, as shown in FIG. 7 (step S10).

If selecting the SLC mode according to the SLC command received from the controller 200 (step S11_Yes), for example, the sequencer 14 sets a voltage VGP1 as the voltage of the dummy word lines WLD in the program operation (step S12). The voltage VGP1 is a voltage to turn on the dummy memory cell transistors MTD, independently of the threshold voltage of the dummy memory cell transistors MTD at the time of the program operation.

On the other hand, for example, if selecting the MLC mode according to the MLC command received from the controller 200, namely, if not selecting the SLC mode (step S11_No), the sequencer 14 sets a voltage VGP2 as the voltage of the dummy word lines WLD in the program operation (step S13). The voltage VGP2 is a voltage to turn on the dummy memory cell transistors MTD independently of the threshold voltage of the dummy memory cell transistors MTD at the time of the program operation. The relationship between the voltage VGP1 and the voltage VGP2 is VGP1<VGP2.

Next, the row decoder 11 applies a program voltage to the selected word line WL in the program operation (step S14). More specifically, in the first program operation, the row decoder 11 applies a voltage VPGM to the selected word line WL as the program voltage, and applies the voltage VPASS to the non-selected word line WL. The relationship between the voltage VPGM and the voltage VPASS is VPASS<VPGM. Also, the row decoder 11 applies the voltage VGP1 to the dummy word lines WLD if the sequencer 14 selects the SLC mode, and applies the voltage VGP2 to the dummy word lines WLD if the sequencer 14 selects the MLC mode.

Next, the sequencer 14 performs the verify operation (step S15).

If passing the verify operation (step S16_Yes), the sequencer 14 ends the write operation.

If failing the verify operation (step S16_No), the sequencer 14 confirms whether the number of times of the program loop reaches a prescribed number of times set in advance (step S17).

If the program loop reaches the prescribed number of times (step S17_Yes), the sequencer 14 ends the write operation, and reports the failure to correctly end the write operation to the controller 200.

If the program loop does not reach the prescribed number of times (step S17_No), the sequencer 14 steps up the setting of the program voltage in the next program loop (step S18). Then, the sequencer 14 returns to step S14, and applies the program voltage again.

The sequencer 14 repeats the program loop until the verify operation is passed or the number of times of the program loop reaches the prescribed number of times.

1.3.3. Voltage of Each Interconnect at the Time of the Program Operation

Next, the voltage of each interconnect at the time of the program operation will be described with reference to FIG. 8. The example in FIG. 8 shows the voltages applied to each interconnect in the selected block BLK at the time of the first program operation.

Figure 8:
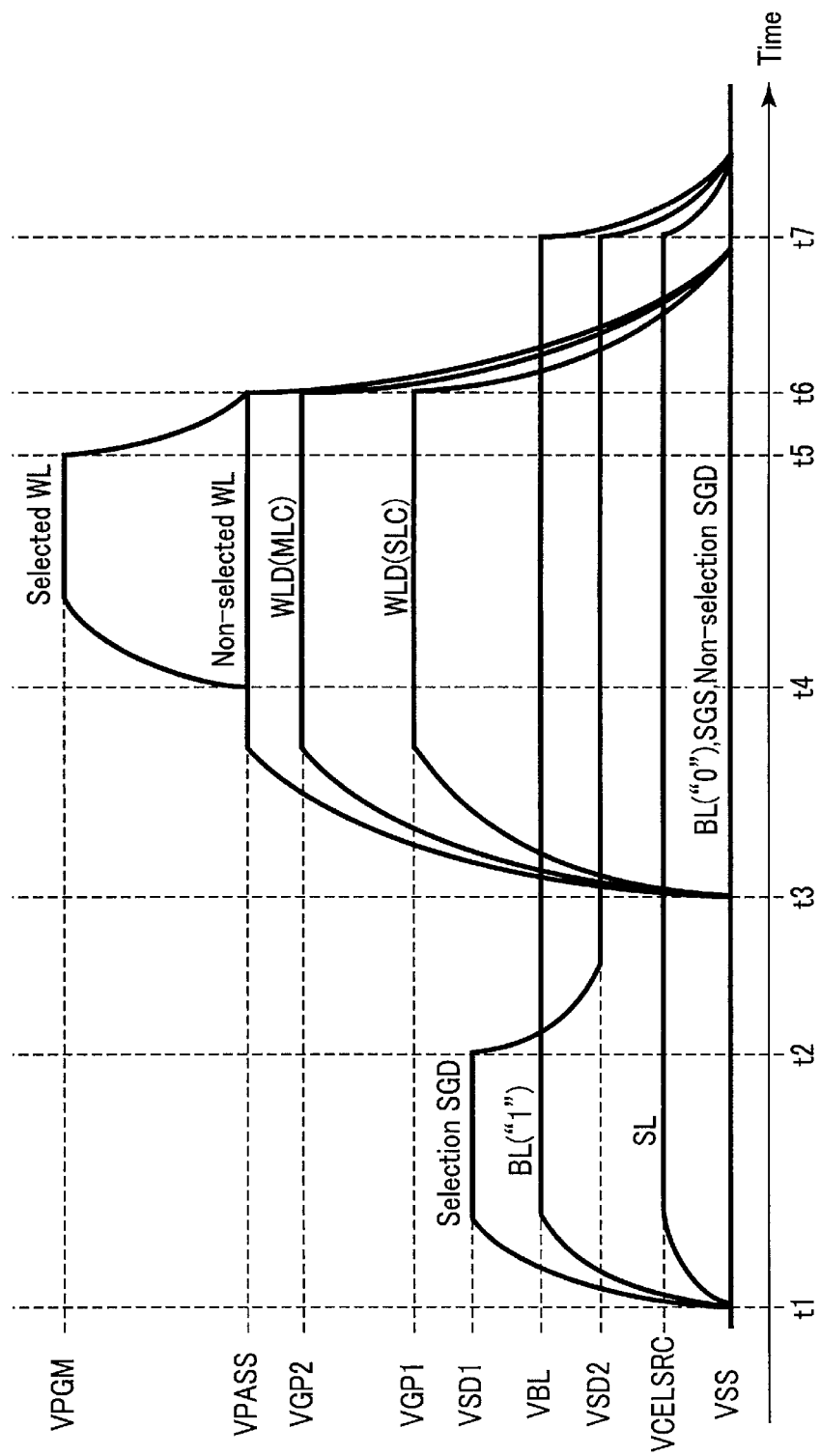
FIG. 8 is a timing chart showing a voltage of each interconnect at a time of the write operation of the semiconductor memory device according to the first embodiment.

At time t1, the row decoder 11 applies a voltage VSD1 to the selection gate line SGD ("selection SGD") corresponding to the selected string unit SU, as shown in FIG. 8. When the threshold voltage of the selection transistor ST1 is defined as Vtsg, the voltage VSD1 is a voltage of "VBL+ Vtsg" or more and is a voltage to turn on the selection transistor ST1. On the other hand, the row decoder 11 applies the voltage VSS to the selection gate line SGD ("non-selection SGD") of the non-selected string unit SU, and turns off the corresponding selection transistor ST1. The row decoder 11 also applies the voltage VSS to each selection gate line SGS, and turns off the selection transistor ST2.

The source line driver 13 applies a voltage VCELSRC (>VSS) to the source line SL.

The sense amplifier 12 applies the voltage VBL to the bit line BL ("1"), and applies the voltage VSS to the bit line BL ("0").

Thereby, the voltage VBL is applied to the channel of the selected NAND string 16 corresponding to the bit line BL ("1"), and the voltage VSS is applied to the channel of the selected NAND string 16 corresponding to the bit line BL ("0").

At time t2, the row decoder 11 applies a voltage VSD2 to the selection gate line SGD corresponding to the selected string unit SU. The voltage VSD2 is a voltage that is lower than the voltage VSD1 and the voltage VBL, and is a voltage that turns on the selection transistor ST1 to which the voltage VSS is applied, but cuts off the selection transistor ST1 to which the voltage VBL is applied. Thereby, the channel of the NAND string 16 corresponding to the bit line BL ("1") is in a floating state.

At time t3, the row decoder 11 applies the voltage VPASS to the selected and non-selected word lines WL. The row decoder 11 applies the voltage VGP1 to the dummy word lines WLD in the SLC mode, and applies the voltage VGP2 to the dummy word lines WLD in the MLC mode. In the example shown in FIG. 8, the voltage VPASS, the voltage VGP1, and the voltage VGP2 are in a relationship of VGP1<VGP2<VPASS, but the relationship between the voltage VPASS and the voltage VGP2 (VGP1) is not limited thereto. For example, the voltage VGP2 may be equal to or greater than the voltage VPASS.

Between time t4 and time t5, the row decoder 11 applies the voltage VPGM to the selected word line WL as a program voltage.

In the NAND string 16 corresponding to the bit line BL ("0"), the selection transistor ST1 is turned on. Thus, the channel potential of the memory cell transistors MT coupled to the selected word line WL is maintained at VSS. Accordingly, the difference in potential between the control gate and the channel (VPGM-VSS) increases; as a result, electrons are injected into the charge storage layer, and the threshold voltage of the memory cell transistors MT increases.

In the NAND string 16 corresponding to the bit line BL ("1"), the selection transistor ST1 is cut off. Thus, the channel of the memory cell transistors MT coupled to the selected word line WL is electrically floating. Then, the channel potential increases by the capacitive coupling with the word lines WL. Therefore, the difference in potential between the control gate and the channel decreases; as a result, few electrons are injected into the charge storage layer, and the threshold voltage of the memory cell transistors MT is maintained (the threshold voltage does not fluctuate to the degree that the threshold distribution level shifts to a higher distribution).

At time t5, the row decoder 11 applies the voltage VPASS to the selected word line WL.

From time t6 to time t7, the sequencer 14 performs recovery processing, and ends the program operation. Namely, the voltage VSS is applied to each interconnect.

1.3.4. Channel Potential of the NAND Strings at the Time of the Program Operation.

Figure 9:
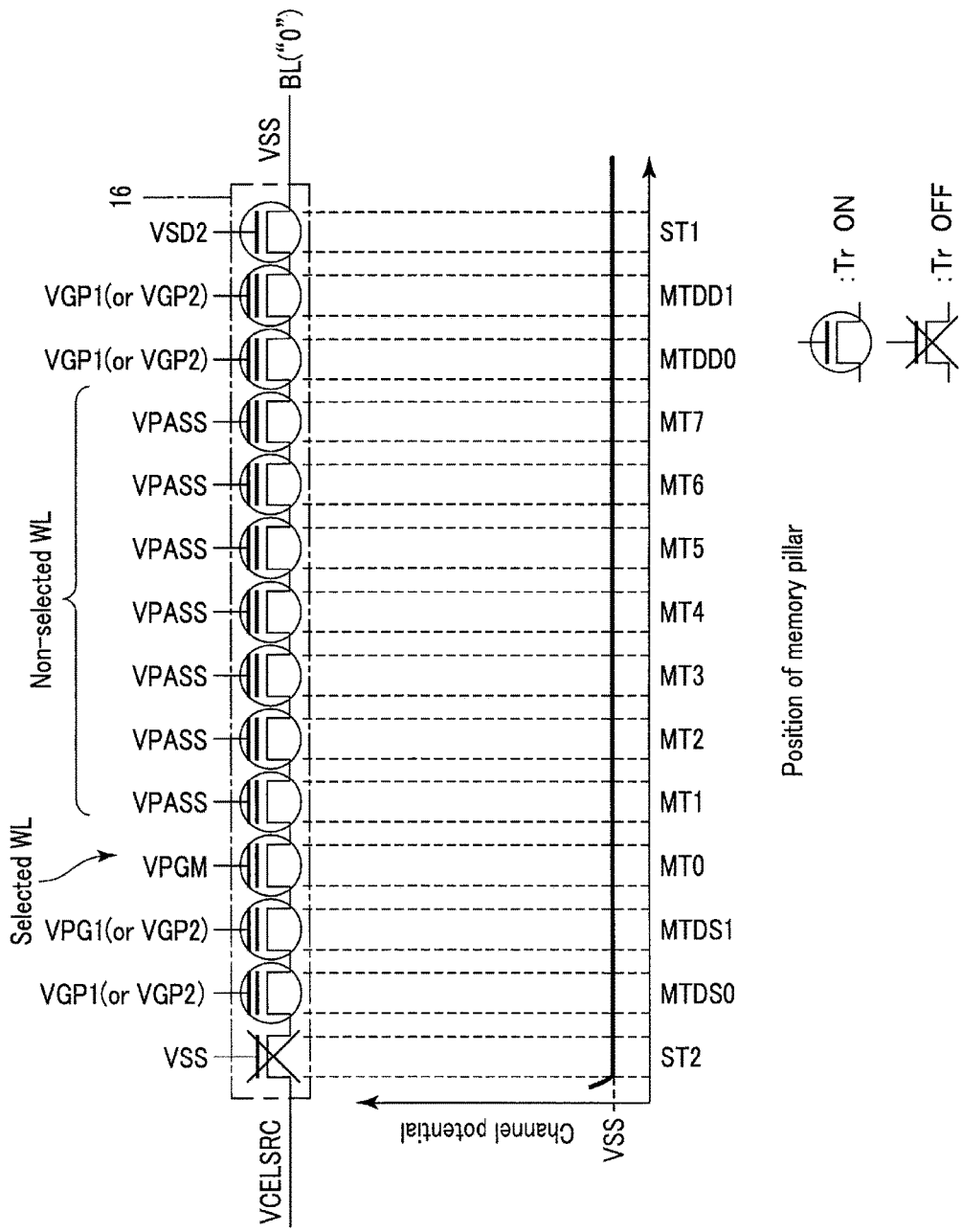
FIG. 9 is a diagram showing a channel potential of a NAND string corresponding to writing "0" of the semiconductor memory device according to the first embodiment.

Next, the channel potential of the NAND strings 16 at the time of the program operation will be described with reference to FIGS. 9 and 10. FIG. 9 shows the channel potential of the NAND string 16 corresponding to the bit line BL ("0") at time t3 and from time t4 to time t5 shown in FIG. 8. Likewise, FIG. 10 shows the channel potential of the NAND string 16 corresponding to the bit line BL ("1"). The examples in FIGS. 9 and 10 show a case where the memory cell transistor MT0 is selected.

First, the channel potential of the NAND string 16 corresponding to the bit line BL ("0") will be described.

The sense amplifier 12 applies the voltage VSS to the bit line BL ("0"), as shown in FIG. 9. The source line driver 13 applies the voltage VCELSRC to the source line SL. The row decoder 11 applies the voltage VSS to the selection gate line SGS, and applies the voltage VSD2 to the selection gate line SGD. Thereby, the selection transistor ST2 is turned off, and the selection transistor ST1 is turned on.

In this state, the row decoder 11 applies the voltage VPGM to the selected word line WL0, and applies the voltage VPASS to the non-selected word lines WL1 to WL7. The row decoder 11 applies the voltage VGP1 to the dummy word lines WLD (WLDD0, WLDS1, WLDD0, and WLDD1) in the SLC mode, and applies the voltage VGP2 to the dummy word lines WLD in the MLC mode. A different voltage may be applied to each of the non-selected word lines WL1 to WL7.

Since the selection transistor ST1 is turned on in the NAND string 16 corresponding to the bit line BL ("0"), the channel potential in the NAND string 16 is fixed at VSS regardless of the voltage VPGM, the voltage VPASS, and the voltage VGP1 (or VGP2).

Next, the channel potential of the NAND string 16 corresponding to the bit line BL ("1") will be described.

The sense amplifier 12 applies the voltage VBL to the bit line BL ("1"), as shown in FIG. 10. The voltages of the source line SL and the selection gate lines SGS and SGD are the same as those shown in FIG. 9. Thereby, the selection transistors ST1 and ST2 are turned off. Therefore, the NAND string 16 corresponding to the bit line BL ("1") is in a floating state.

In this state, the row decoder 11 applies the voltage VPGM, the voltage VPASS, and the voltage VGP1 (or VGP2) to the selected word line WL0, the non-selected word lines WL1 to WL7, and the dummy word lines WLD, respectively, in a manner similar to FIG. 9.

Then, the channel potential immediately below the respective memory cell transistors MT and the respective dummy memory cell transistors MTD increases by the capacitive coupling with the word lines WL and the dummy word lines WLD. More specifically, immediately below the selected memory cell transistor MT0, the channel potential increases according to the voltage VPGM. The channel potential at this time is defined as Vp_PGM. Immediately below the non-selected memory cell transistors MT (MT1 to MT7), the channel potential increases according to the voltage VPASS. The channel potential at this time is defined as Vp_PAS. Immediately below the dummy memory cell transistors MTD (MTDS0, MTDS1, MTDD0, and MTDD1), the channel potential increases according to the voltage VGP1 (or VGP2). The channel potential at this time is defined as Vp_GP1 (or Vp_GP2). In the case of VPGM>PASS>VGP2>VGP1, the channel potentials Vp_PGM, Vp_PAS, Vp_GP2, and Vp_GP1 are in a relationship of Vp_PGM>Vp_PAS>Vp_GP2>Vp_GP1.

Between the selection transistor ST2 and the adjacent dummy memory cell transistor MTDS0, the difference in the channel potential of Vp_GP1 occurs in the SLC mode, and the difference in the channel potential of Vp_GP2 occurs in the MLC mode. Therefore, the difference in the channel potential between the selection transistor ST2 and the dummy memory cell transistor MTDS0 is smaller when the SLC mode is selected than when the MLC mode is selected.

Between the dummy memory cell transistor MTDS1 and the adjacent selected memory cell transistor MT0, the difference in the channel potential of ((Vp_PGM)−(Vp_GP1)) occurs in the SLC mode, and the difference in the channel potential of ((Vp_PGM)−(Vp_GP2)) occurs in the MLC mode. Therefore, the difference in the channel potential between the dummy memory cell transistor MTDS1 and the memory cell transistor MT0 is smaller when the MLC mode is selected than when the SLC mode is selected.

Also, the difference in the potential of ((Vp_PGM)−(Vp_PAS)) occurs between the memory cell transistor MT0 and the memory cell transistor MT1. Between the memory cell transistor MT7 and the adjacent dummy memory cell transistor MTDD0, the difference in the channel potential of ((Vp_PAS)−(Vp_GP1)) occurs in the SLC mode, and the difference in the channel potential of ((Vp_PAS)−(Vp_GP2)) occurs in the MLC mode. Between the selection transistor ST2 and the adjacent dummy memory cell transistor MTDS0, the difference in the channel potential of Vp_GP1 occurs in the SLC mode, and the difference in the channel potential of Vp_GP2 occurs in the MLC mode. Between the dummy memory cell transistor MTDD1 and the adjacent selection transistor ST1, the difference in the channel potential of Vp_GP1 occurs in the SLC mode, and the difference in the channel potential of Vp_GP2 occurs in the MLC mode.

1.4. Advantageous Effects of the Present Embodiment

The configuration according to the present embodiment can improve the reliability. Hereinafter, the advantageous effects will be detailed.

At the time of the program operation, the NAND string 16 corresponding to the "1" write is in a floating state. The channel potential increases by the capacitive coupling with the word lines WL and the dummy word lines WLD. Thereby, few charges are injected into the charge storage layer. Therefore, in the NAND string 16 corresponding to the "1" write, the difference in potential occurs in the channel according to the voltage of the word lines WL and the dummy word lines WLD. In this case, an interband tunnel current is likely to be generated between the adjacent transistors having a large difference in the channel potential. Then, a hot carrier is injected into the charge storage layer, and the threshold voltage of the memory cell transistors MT or the dummy memory cell transistors MTD increases.

For example, if the difference in the channel potential between the selection transistor ST2 and the dummy memory cell transistor MTDS0 increases, the hot carrier is injected into the dummy memory cell transistor MTDS0 by the interband tunnel current, and the threshold voltage increases. If the threshold voltage of the dummy memory cell transistor MTDS0 increases, the dummy memory cell transistor MTDS0 is more likely to malfunction in the operation of writing, reading, and deleting.

Also, if, for example, the difference in the channel potential between the dummy memory cell transistor MTDS1 and the memory cell transistor MT0 becomes significant, the threshold voltage of the memory cell transistor MT0 increases due to the interband tunnel current. Then, the fail bit increases. A similar problem is likely to occur in the selection transistor ST1, the dummy memory cell transistors MTDD (MTDD0 and MTDD1), and the memory cell transistor MT7 adjacent to the dummy memory cell transistors MTDD.

The degree of the influence of the above problem differs between the SLC mode and the MLC mode (multi-level write mode). For example, there is a case where the set maximum number of times of rewrite is larger in the SLC mode than in the MLC mode. In this case, the influence of the malfunction due to the increase of the threshold voltage of the dummy memory cell transistors MTD is greater than in the MLC mode. Also, writing at a high threshold level is unnecessary in the SLC mode, and therefore, the program voltage can be lower than in the MLC mode. Therefore, the influence of the increase of the fail bit due to the increase of the threshold voltage of the memory cell transistors MT is smaller than in the MLC mode. Accordingly, it is important to reduce the difference in the channel potential between the selection transistor ST2 and the dummy memory cell transistor MTDS0 in the SLC mode.

On the other hand, writing at a high threshold level is necessary in the MLC mode, and therefore, the program voltage is likely to be higher than in the SLC mode. Therefore, the influence of the increase of the fail bit due to the increase of the threshold voltage of the memory cell transistors MT is greater than in the SLC mode. Accordingly, it is important to reduce the difference in the channel potential between the dummy memory cell transistor MTDS1 and the memory cell transistor MT0 in the MLC mode.

In view of the above, the configuration of the present embodiment includes the two program modes, the SLC mode and the MLC mode, in the write operation. The voltage of the dummy word lines WLD in the SLC mode can be made to be smaller than the voltage of the dummy word lines WLD in the MLC mode. Thereby, in the SLC mode, for example, the difference in the channel potential between the selection transistor ST2 and the dummy memory cell transistor MTDS0 of the NAND string 16 corresponding to the "1" write can be reduced. Therefore, the malfunction associated with the increase of the threshold voltage of the dummy memory cell transistor MTDS0 can be inhibited. Also, in the MLC mode, for example, the difference in the channel potential between the dummy memory cell transistor MTDS1 and the memory cell transistor MT0 of the NAND string 16 corresponding to the "1" write can be reduced. Thereby, the increase of the fail bit due to the increase of the threshold voltage of the memory cell transistor MT0 can be inhibited. Accordingly, the reliability of the semiconductor memory device and the memory system can be improved.

2. Second Embodiment

Next, a semiconductor memory device and a memory system according to the second embodiment will be described. In the second embodiment, a case where different voltages are applied to the dummy word lines WLDS0 and WLDS1, and different voltages are applied to the dummy word lines WLDD0 and WLDD1, will be described. Hereinafter, only the matters different from the first embodiment will be described.

2.1. Overall Flow of the Write Operation of the Semiconductor Memory Device

First, the overall flow of the write operation of the semiconductor memory device will be described with reference to FIG. 11. The example shown in FIG. 11 describes a case where the same voltage is applied to the dummy word lines WLDS0 and WLDD1, and where the same voltage is applied to the dummy word lines WLDS1 and WLDD0. Different voltages may be applied to the dummy word lines WLDS0 and WLDD1, and different voltages may be applied to the dummy word lines WLDS1 and WLDD0.

Figure 11:
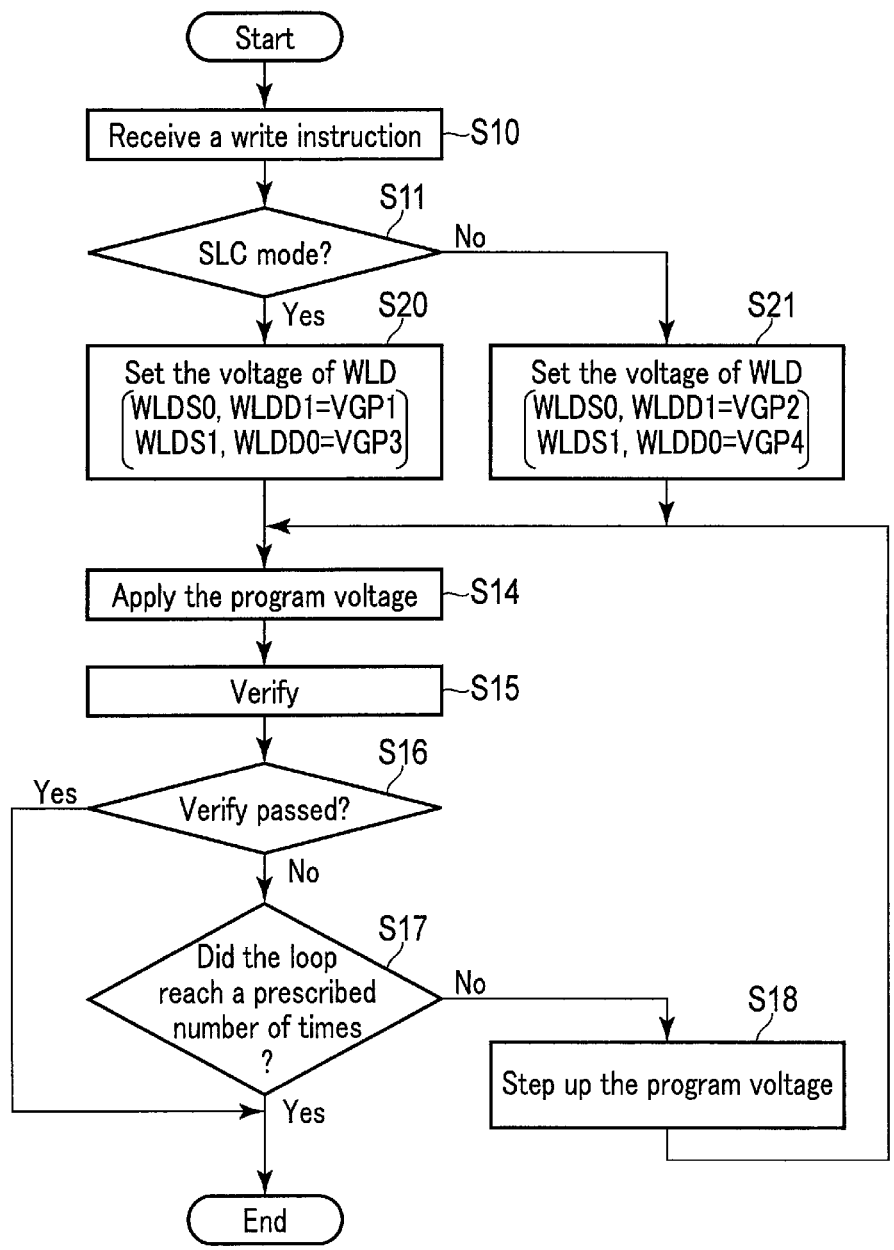
FIG. 11 is a flowchart showing a write operation of a semiconductor memory device according to a second embodiment.

In the present embodiment, if selecting the SLC mode (step S11_Yes), the sequencer 14 sets the voltage VGP1 as the voltage of the dummy word lines WLDS0 and WLDD1 in the program operation, and sets the voltage VGP3 (>VGP1) as the voltage of the dummy word lines WLDS1 and WLDD0 in the program operation (step S20), as shown in FIG. 11.

On the other hand, if selecting the MLC mode (step S11_No), the sequencer 14 sets the voltage VGP2 as the voltage of the dummy word lines WLDS0 and WLDD1 in the program operation, and sets the voltage VGP4 (>VGP2) as the voltage of the dummy word lines WLDS1 and WLDD0 in the program operation (step S21).

The operations in step S14 and the subsequent steps are the same as those of the first embodiment shown in FIG. 7.

2.2. Voltage of Each Interconnect at the Time of the Program Operation

Next, the voltage of each interconnect at the time of the program operation will be described with reference to FIG. 12. The example in FIG. 12 shows a voltage applied to each interconnect in the selected block BLK at the time of the first program operation.

As shown in FIG. 12, the voltage of each interconnect from time t1 to time t3 is the same as that of the first embodiment shown in FIG. 8.

At time t3, the row decoder 11 applies the voltage VPASS to the selected and non-selected word lines WL. In the SLC mode, the row decoder 11 applies the voltage VGP1 to the dummy word lines WLDS0 and WLDD1, and applies the voltage VGP3 to the dummy word lines WLDS1 and WLDD0. On the other hand, in the MLC mode, the row decoder 11 applies the voltage VGP2 to the dummy word lines WLDS0 and WLDD1, and applies the voltage VGP4 to the dummy word lines WLDS1 and WLDD0. In the example shown in FIG. 12, the voltages VGP1 to VGP4 are in a relationship of VGP1<VGP2<VGP1<VGP4, but the relationship among the voltages is not limited thereto. The voltage VGP2 may be discretionarily set as long as it is higher than the voltage VGP1 and less than the voltage VGP4. The voltage VGP3 may be discretionarily set as long as it is higher than the voltage VGP1 and less than the voltage VGP4. Therefore, the relationship between the voltage VGP2 and the voltage VGP3 is not limited.

Between time t4 and time t5, the row decoder 11 applies the voltage VPGM to the selected word lines WL as a program voltage.

Time t5 and the subsequent times are the same as those of the first embodiment shown in FIG. 8.

2.3. Channel Potential of the NAND Strings at the Time of the Program Operation.

Next, the channel potential of the NAND strings 16 at the time of the program operation will be described with reference to FIG. 13. In the present embodiment, the channel potential of the NAND string 16 corresponding to the bit line BL ("1") will be described. The channel potential of the NAND string 16 corresponding to the bit line BL ("0") is the same as that of the first embodiment shown in FIG. 9.

In manner similar to FIG. 10 of the first embodiment, the selection transistors ST1 and ST2 are turned off, and the NAND string 16 corresponding to the bit line BL ("1") is in a floating state, as shown in FIG. 13.

In this state, the row decoder 11 applies the voltage VPGM to the selected word line WL0, and applies the voltage VPASS to the non-selected word lines WL1 to WL7. The row decoder 11 applies the voltage VGP1 (or VGP2) to the dummy word lines WLDS0 and WLDD1, and applies the voltage VGP3 (or VGP4) to the dummy word lines WLDS1 and WLDD0.

The channel potential increases according to the voltage VGP1 (or VGP2) immediately below the dummy memory cell transistors MTDS0 and MTDD1, and the channel potential increases according to the voltage VGP3 (or VGP4) immediately below the dummy memory cell transistors MTDS1 and MTDD0. The channel potential at this time is defined as Vp_GP3 (or Vp_GP4). Then, in the case of VPGM>VPASS>VGP4>VGP3>VGP2>VGP1, the channel potential is in relationship of Vp_PGM>Vp_PAS>Vp_GP4>Vp_GP3>Vp_GP2>Vp_GP1.

Between the selection transistor ST2 and the adjacent dummy memory cell transistor MTDS0, the difference in the channel potential of Vp_GP1 occurs in the SLC mode, and the difference in the channel potential of Vp_GP2 occurs in the MLC mode. Between the dummy memory cell transistor MTDS0 and the dummy memory cell transistor MTDS1, the difference in the channel potential of ((Vp_GP3)−(Vp_GP1)) occurs in the SLC mode, and the difference in the channel potential of ((Vp_GP4)−(Vp_GP2)) occurs in the MLC mode. Also, between the dummy memory cell transistor MTDS1 and the adjacent selected memory cell transistor MT0, the difference in the channel potential of ((Vp_PGM)−(Vp_GP3)) occurs in the SLC mode, and the difference in the channel potential of ((Vp_PGM)−(Vp_GP4)) occurs in the MLC mode.

2.4. Advantageous Effects of the Present Embodiment

The configuration of the present embodiment achieves advantageous effects similar to those achieved by the first embodiment.

Moreover, in the configuration according to the present embodiment, it is possible to apply a higher voltage to the dummy word line WLDS1 than that applied to the dummy word line WLDS0, and apply a higher voltage to the dummy word line WLDD0 than that applied to the dummy word line WLDD1 at the time of the program operation. Thereby, the difference in the channel potential between the selection transistor ST2 and the dummy memory cell transistor MTDS0, and the difference in the channel potential between the dummy memory cell transistor MTDS1 and the memory cell transistor MT0 can be further reduced in the SLC mode and the MLC mode. Likewise, the difference in the channel potential between the selection transistor ST1 and the dummy memory cell transistor MTDD1, and the difference in the channel potential between the dummy memory cell transistor MTDD0 and the adjacent memory cell transistor MT7, can be further reduced. Thus, the malfunction associated with the increase of the threshold voltage of the dummy memory cell transistors MTD, and the increase of the fail bit due to the increase of the threshold voltage of the memory cell transistors MT can be inhibited in the SLC mode and the MLC mode. Accordingly, the reliability of the semiconductor memory device and the memory system can be improved.

3. Third Embodiment

Next, the third embodiment will be described. In the third embodiment, a case of stepping up the voltage applied to the selected word line WL, the non-selected word line WL, and the dummy word lines WLD when repeating the program loop, will be described. Hereinafter, only the matters different from the first and the second embodiments will be explained.

3.1. Overall Flow of the Write Operation of the Semiconductor Memory Device

First, the overall flow of the write operation of the semiconductor memory device will be described with reference to FIG. 14.

As shown in FIG. 14, the operations from step S10 to step S17 are the same as those of the first embodiment shown in FIG. 7.

If the program loop does not reach a prescribed number of times in step S17 (step S17_No), the sequencer 14 steps up the setting of the voltage applied to the selected word line WL, the non-selected word line WL, and the dummy word lines WLD in the next program loop (step S18). Then, the sequencer 14 returns to step S14, and applies the program voltage again.

The sequencer 14 repeats the program loop until the verify operation is passed or the number of times of the program loop reaches the prescribed number of times.

3.2. Voltage of the Word Lines and the Dummy Word Lines at the Time of the Program Operation Next, the voltage of the word lines WL and the dummy word lines WLD at the time of the program operation will be described with reference to FIG. 15. The example in FIG. 15 briefly shows the voltage of the word lines WL and the dummy word lines WLD at three program operations. In the example shown in FIG. 15, the verify operation performed after each program operation is omitted to simplify the description.

First, in the first program operation, the row decoder 11 applies the voltage VPGM to the selected word line WL as the program voltage, and applies the voltage VPASS to the non-selected word line WL, as shown in FIG. 15. The row decoder 11 applies the voltage VGP1 to the dummy word lines WLD in the SLC mode, and applies the voltage VGP2 to the dummy word lines WLD in the MLC mode.

Next, in the second program operation, the sequencer steps up the setting of the voltage applied to the selected word line WL, the non-selected word line WL, and the dummy word lines WLD. More specifically, a step-up range of the voltage VPGM is set as DVPG, and a step-up range of the voltage VPASS is set as DVPA. In addition, a step-up range of the voltage VGP1 is set as DVG1, and a step-up range of the voltage VGP2 is set as DVG2. The step-up ranges DVPG, DVPA, DVG1, and DVG2 may be the same, or may be different from one another. The row decoder 11 applies a voltage (VPGM+DVPG) to the selected word line WL, and applies a voltage (VPASS+DVPA) to the non-selected word line WL. Also, the row decoder 11 applies a voltage (VGP1+DVG1) to the dummy word lines WLD in the SLC mode, and applies a voltage (VGP2+DVG2) to the dummy word lines WLD in the MLC mode.

Next, in the third program operation, the sequencer 14 steps up the setting of the voltage applied to the selected word line WL, the non-selected word line WL, and the dummy word lines WLD, in a manner similar to the second program operation. The row decoder 11 applies a voltage (VPGM+2·DVPG) to the selected word line WL, and applies a voltage (VPASS+2·DVPA) to the non-selected word line WL. Also, the row decoder 11 applies a voltage (VGP1+2·DVG1) to the dummy word lines WLD in the SLC mode, and applies a voltage (VGP2+2·DVG2) to the dummy word lines WLD in the MLC mode.

In the fourth and the subsequent program operations as well, the sequencer 14 repeats stepping up the setting of the voltage applied to the selected word line WL, the non-selected word line WL, and the dummy word lines WLD.]

3.3. Advantageous Effects of the Present Embodiment

The configuration of the present embodiment achieves advantageous effects similar to those achieved by the first embodiment.

Furthermore, the present embodiment may be combined with the second embodiment. Thereby, the present embodiment achieves advantageous effects similar to those achieved by the second embodiment.

Also, the configuration of the present embodiment makes it possible to step up the voltage applied to the non-selected word line WL and the dummy word lines WLD. Thereby, even if the program loop is repeated, it is possible to reduce the difference in the channel potential between the selection transistor ST2 (or ST1) and the dummy memory cell transistors MTD, and the difference in the channel potential between the dummy memory cell transistors MTD and the memory cell transistors MT in the NAND string 16 corresponding to the "1" write. Thereby, the malfunction of the dummy memory cell transistors MTD due to the increase of the threshold of the dummy memory cell transistors MTD, and the fail bit due to the increase of the threshold of the memory cell transistors MT can be inhibited. Accordingly, the reliability of the semiconductor memory device and the memory system can be improved.

4. Fourth Embodiment

Next, the fourth embodiment will be described. In the fourth embodiment, a case of including three program modes will be described. Hereinafter, only the matters different from the first to third embodiments will be described.

4.1. Program Operation

First, the program operation will be described. The program operation of the present embodiment includes three program modes: the SLC mode; the MLC mode; and a TLC write mode to write three-bit data to the memory cell transistors MT (hereinafter referred to as "TLC mode"). The sequencer selects the program mode according to the write instruction from the controller 200, for example.

4.2. Overall Flow of the Write Operation of the Semiconductor Memory Device

Next, the overall flow of the write operation of the semiconductor memory device will be described with reference to FIG. 16.

Figure 16:
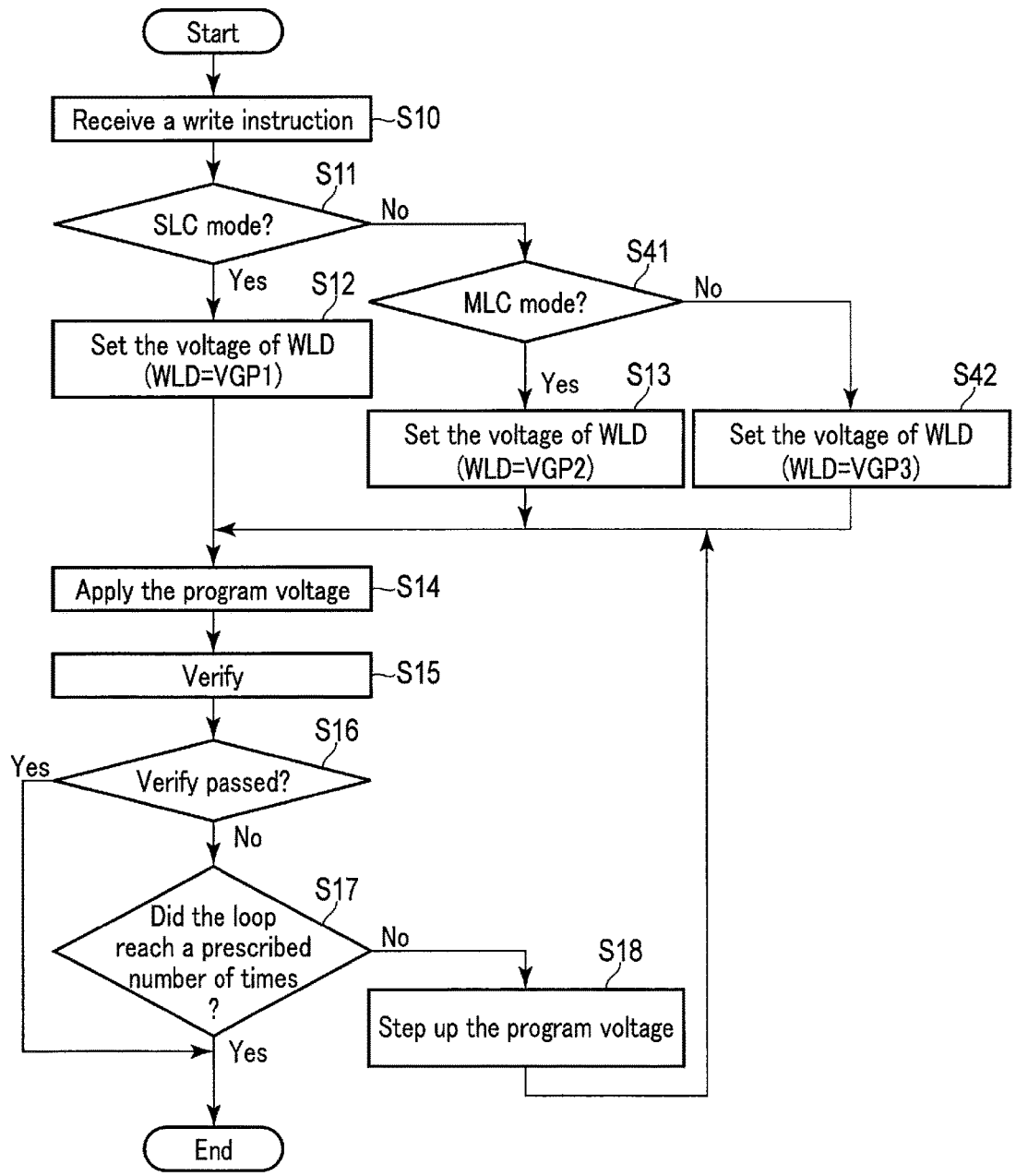
FIG. 16 is a flowchart showing a write operation of a semiconductor memory device according to a fourth embodiment.

First, the NAND flash memory 100 receives a write instruction from the controller 200, as shown in FIG. 16 (step S10).

If selecting the SLC mode according to the SLC command received from the controller 200 (step S11_Yes), for example, the sequencer 14 sets the voltage VGP1 as the voltage of the dummy word lines WLD in the program operation (step S12).

Also, if selecting the MLC mode according to the MLC command received from the controller 200 (step S41 Yes), for example, instead of selecting the SLC mode (step S11_No), the sequencer 14 sets the voltage VGP2 as the voltage of the dummy word lines WLD in the program operation (step S13).

If selecting the TLC mode according to a TLC command received from the controller 200, namely, if not selecting the MLC mode (step S41_No), for example, the sequencer 14 sets a voltage VGP3 as the voltage of the dummy word lines WLD in the program operation (step S42). The voltage VGP3 is a voltage to turn on the dummy memory cell transistors MTD independently of the threshold voltage of the dummy memory cell transistors MTD at the time of the program operation. The relationship among the voltages VGP1, VGP2, and VGP3 is VGP1<VGP2<VGP3.

The operations in step S14 and the subsequent steps are the same as those of the first embodiment shown in FIG. 7.

4.3. Advantageous Effects of the Present Embodiment

The configuration of the present embodiment achieves advantageous effects similar to those achieved by the first embodiment.

Furthermore, the present embodiment can be combined with the second and the third embodiments. Thereby, the present embodiment achieves advantageous effects similar to those of the second and third embodiments.

Also, the configuration of the present embodiment includes three program modes, the SLC mode, the MLC mode, and the TLC mode, in the write operation. It is possible to make the voltage of the dummy word lines WLD in the SLC mode lower than the voltage of the dummy word lines WLD in the MLC mode, and possible to make the voltage of the dummy word lines WLD in the TLC mode higher than the voltage of the dummy word lines WLD in the MLC mode. Thereby, in the TLC mode, for example, the difference in the channel potential between the dummy memory cell transistor MTDS1 and the memory cell transistor MT0 of the NAND string 16 corresponding to the "1" write can be reduced. Therefore, the increase of the fail bit due to the increase of the threshold voltage of the memory cell transistors MT can also be inhibited in the TLC mode. Accordingly, the reliability of the semiconductor memory device and the memory system can be improved.

5. Modification, Etc.

The semiconductor memory device according to the above embodiments includes: the memory string (16) including the first and second selection transistors (ST2, ST1), the first transistor (MTDS0) coupled to the first selection transistor, and the first and second memory cell transistors (MT0, MT1) coupled between the first transistor and the second selection transistor; the first and second selection gate lines (SGS, SGD) coupled respectively to the gates of the first and second selection transistors; the first word line (WLDS0) coupled to the gate of the first transistor; the second and third word lines (WL0, WL1) coupled respectively to the gates of the first and second memory cell transistors; and the row decoder (11) configured to apply a voltage to the first and second selection gate lines and to the first to third word lines. The write operation includes the first mode (SLC) to write one-bit data and the second mode (MLC) to write two-bit data. In the case of writing one-bit data to the first memory cell transistor (MT0) in the first mode, the row decoder applies the first voltage (VGP1) to the first word line. In the case of writing two-bit data to the first memory cell transistor in the second mode, the row decoder applies, to the first word line, the second voltage (VGP2) that is higher than the first voltage.

By applying the above embodiments, it is possible to provide a semiconductor memory device that can improve the reliability.

The embodiments are not limited to the above-described aspects, but can be modified in various ways.

For example, the above embodiments can be combined as far as possible.

In addition, the above embodiments are not limited to the three-dimensional stacked NAND flash memory, and may also be applied to a flat NAND flash memory in which a memory cell is arranged on a semiconductor substrate.

Furthermore, the term "couple" in the above embodiments includes a state of indirect coupling via a transistor or a resistance, etc.

Each embodiment relating to the present invention may adopt the configuration described below. For example, the configuration when the memory cell transistors MT can hold two-bit (four-value) data, and the threshold levels at the time of holding one of four values are defined as an Er level (delete level), A level, B level, and C level in ascending order, is described below.

(1) In the read operation, the voltage applied to the word line selected for the A-level read operation is, for example, between 0 V and 0.55 V. The voltage is not limited thereto, and may be either between 0.1 V and 0.24 V, between 0.21 V and 0.31 V, between 0.31 V and 0.4 V, between 0.4 V and 0.5 V, or between 0.5 V and 0.55 V.

The voltage applied to the word line selected for the B-level read operation is, for example, between 1.5 V and 2.3 V. The voltage is not limited thereto, and may be either between 1.65 V and 1.8 V, between 1.8 V and 1.95 V, between 1.95 V and 2.1 V, or between 2.1 V and 2.3 V.

The voltage applied to the word line selected for the C-level read operation is, for example, between 3.0 V and 4.0 V. The voltage is not limited thereto, and may be either between 3.0 V and 3.2 V, between 3.2 V and 3.4 V, between 3.4 V and 3.5 V, between 3.5 V and 3.6 V, or between 3.6 V and 4.0 V.

The read operation time (tR) may be, for example, between 25 μs and 38 μs, between 38 μs and 70 μs, or between 70 μs and 80 μs.

(2) The write operation includes a program operation and a verify operation, as described above. In the write operation, the voltage first applied to the word line selected at the time of the program operation is, for example, between 13.7 V and 14.3 V. The voltage is not limited thereto, and may be either, for example, between 13.7 V and 14.0 V, or between 14.0 V and 14.6 V.

The voltage first applied to the selected word line at the time of writing the odd-numbered word lines, and the voltage first applied to the selected word line at the time of writing the even-numbered word lines may be changed.

When the program operation is an incremental step pulse program (ISPP), the step-up voltage is, for example, approximately 0.5 V.

The voltage applied to the non-selected word line may be, for example, between 6.0 V and 7.3 V. The voltage is not limited to this case, and may be, for example, between 7.3 V and 8.4 V, or may be 6.0 V or less.

The pass voltage to be applied may be changed depending on whether the non-selected word line is an odd-numbered word line or an even-numbered word line.

The write operation time (tProg) may be, for example, between 1700 μs and 1800 μs, between 1800 μs and 1900 μs, or between 1900 μs and 2000 μs.

(3) In the delete operation, the voltage first applied to the well that is formed on the semiconductor substrate and above which the aforementioned memory cell is disposed, is for example, between 12 V and 13.6 V. The voltage is not limited to this case, and may be, for example, between 13.6 V and 14.8 V, between 14.8 V and 19.0 V, between 19.0 V and 19.8 V, or between 19.8 V and 21 V.

The delete operation time (tErase) may be, for example, between 3000 μs and 4000 μs, between 4000 μs and 5000 μs, or between 4000 μs and 9000 μs.

(4) The structure of the memory cell includes a charge storage layer disposed on a semiconductor substrate (silicon substrate) via a tunnel insulation film having a thickness of 4 to 10 nm. This charge storage layer can have a layered structure of an insulation film, such as SiN or SiON, having a thickness of 2 to 3 nm and polysilicon having a thickness of 3 to 8 nm. The polysilicon may include a metal such as Ru. An insulation film is provided on the charge storage layer. This insulation film includes, for example, a silicon dioxide film having a thickness of 4 to 10 nm that is interposed between a lower High-k film having a thickness of 3 to 10 nm and an upper High-k film having a thickness of 3 to 10 nm. Examples of the High-k film include HfO. The thickness of the silicon dioxide film may be larger than that of the High-k film. A control electrode having a thickness of 30 nm to 70 nm is formed on the insulation film via a material for adjusting the work function having a film thickness of 3 to 10 nm. The material for adjusting the work function is a metal-oxide film, such as TaO, and a metal-nitride film, such as TaN. For example, W may be used for the control electrode.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device comprising:
   a memory string including first and second selection transistors, a first transistor coupled to the first selection transistor, and first and second memory cell transistors coupled between the first transistor and the second selection transistor;
   first and second selection gate lines coupled respectively to gates of the first and second selection transistors;
   a first word line coupled to a gate of the first transistor;
   second and third word lines coupled respectively to gates of the first and second memory cell transistors; and
   a row decoder configured to apply a voltage to the first and second selection gate lines and the first to third word lines,
   wherein:
   a write operation includes a first mode to write one-bit data and a second mode to write two-bit data;
   in the write operation, a program loop including a program operation and a verify operation is repeatedly performed;
   in a case of writing the one-bit data to the first memory cell transistor in the first mode, the row decoder applies a first voltage to the first word line in the program operation; and
   in a case of writing the two-bit data to the first memory cell transistor in the second mode, the row decoder applies, to the first word line, a second voltage that is higher than the first voltage in the program operation.

2. The device according to claim 1, wherein:
   in the case of writing the one-bit data to the first memory cell transistor in the first mode, the row decoder applies the first voltage to the first word line, applies, to the second word line, a fifth voltage that is higher than the first voltage and a fourth voltage, and applies, to the third word line, a sixth voltage that is higher than the first and fourth voltages and is lower than the fifth voltage while applying a third voltage to the first selection gate line and applying, to the second selection gate line, the fourth voltage that is higher than the third voltage; and
   in the case of writing the two-bit data to the first memory cell transistor in the second mode, the row decoder applies the second voltage to the first word line, applies the fifth voltage to the second word line, and applies the sixth voltage to the third word line while applying the third voltage to the first selection gate line and applying the fourth voltage to the second selection gate line.

3. The device according to claim 2, further comprising a fourth word line, wherein:
   the memory string further includes a second transistor coupled between the first transistor and the first memory cell transistor;
   the fourth word line couples a gate of the second transistor to the row decoder;
   in the case of writing the one-bit data to the first memory cell transistor in the first mode, the row decoder applies, to the fourth word line, a seventh voltage that is higher than the first voltage and is lower than the fifth voltage; and
   in the case of writing the two-bit data to the first memory cell transistor in the second mode, the row decoder applies, to the fourth word line, an eighth voltage that is higher than the second voltage and is lower than the fifth voltage.

4. The device according to claim 3, wherein:
   the second transistor is a dummy memory cell transistor.

5. The device according to claim 2, wherein:
   in the case of writing the one-bit data to the first memory cell transistor in the first mode, the row decoder steps up the first, fifth, and sixth voltages every time the program loop is repeated; and
   in the case of writing the two-bit data to the first memory cell transistor in the second mode, the row decoder steps up the second, fifth, and sixth voltages every time the program loop is repeated.

6. The device according to claim 1, further comprising a fifth word line, wherein:
   the memory string further includes a third transistor coupled between the first memory cell transistor and the second selection transistor;
   the fifth word line couples a gate of the third transistor to the row decoder;
   in the case of writing the one-bit data to the first memory cell transistor in the first mode, the row decoder applies the first voltage to the fifth word line; and
   in the case of writing the two-bit data to the first memory cell transistor in the second mode, the row decoder applies the second voltage to the fifth word line.

7. The device according to claim 6, wherein:
   the third transistor is a dummy memory cell transistor.

8. The device according to claim 1, further comprising:
   a source line driver;
   a sense amplifier;
   a source line coupling the source line driver to the first selection transistor; and
   a bit line coupling the sense amplifier to the second selection transistor.

9. The device according to claim 1, wherein:
   the first transistor is a dummy memory cell transistor.

10. The device according to claim 1, wherein:
    in the write operation, data is stored in the first memory cell transistor and no data is stored in the first transistor.

11. A memory system comprising:
    a semiconductor memory device; and a controller configured to send a first command to the semiconductor memory device in a case of performing a first mode, and send a second command to the semiconductor memory device in a case of performing a second mode, wherein the semiconductor memory device includes:

a memory string including first and second selection transistors, a first transistor coupled to the first selection transistor, and first and second memory cell transistors coupled between the first transistor and the second selection transistor;

first and second selection gate lines coupled respectively to gates of the first and second selection transistors;

a first word line coupled to a gate of the first transistor;

second and third word lines coupled respectively to gates of the first and second memory cell transistors; and a row decoder configured to apply a voltage to the first and second selection gate lines and the first to third word lines, wherein:

a write operation includes the first mode to write one-bit data and the second mode to write two-bit data;

in the write operation a program loop including a program operation and a verify operation is repeatedly performed;

in a case of writing the one-bit data to the first memory cell transistor in the first mode, the row decoder applies a first voltage to the first word line in the program operation; and in a case of writing the two-bit data to the first memory cell transistor in the second mode, the row decoder applies, to the first word line, a second voltage that is higher than the first voltage in the program operation.

12. The memory system according to claim 11, wherein:

in the case of writing the one-bit data to the first memory cell transistor in the first mode, the row decoder applies the first voltage to the first word line, applies, to the second word line, a fifth voltage that is higher than the first voltage and a fourth voltage, and applies, to the third word line, a sixth voltage that is higher than the first and fourth voltages and is lower than the fifth voltage while applying a third voltage to the first selection gate line and applying, to the second selection gate line, the fourth voltage that is higher than the third voltage; and in the case of writing the two-bit data to the first memory cell transistor in the second mode, the row decoder applies the second voltage to the first word line, applies the fifth voltage to the second word line, and applies the sixth voltage to the third word line while applying the third voltage to the first selection gate line and applying the fourth voltage to the second selection gate line.

13. The memory system according to claim 12, further comprising a fourth word line, wherein:

the memory string further includes a second transistor coupled between the first transistor and the first memory cell transistor;

the fourth word line couples a gate of the second transistor to the row decoder;

in the case of writing the one-bit data to the first memory cell transistor in the first mode, the row decoder applies, to the fourth word line, a seventh voltage that is higher than the first voltage and is lower than the fifth voltage; and in the case of writing the two-bit data to the first memory cell transistor in the second mode, the row decoder applies, to the fourth word line, an eighth voltage that is higher than the second voltage and is lower than the fifth voltage.

14. The memory system according to claim 13, wherein:

the second transistor is a dummy memory cell transistor.

15. The memory system according to claim 12, wherein:

in the case of writing the one-bit data to the first memory cell transistor in the first mode, the row decoder steps up the first, fifth, and sixth voltages every time the program loop is repeated; and in the case of writing the two-bit data to the first memory cell transistor in the second mode, the row decoder steps up the second, fifth, and sixth voltages every time the program loop is repeated.

16. The memory system according to claim 11, further comprising a fifth word line, wherein:

the memory string further includes a third transistor coupled between the first memory cell transistor and the second selection transistor;

the fifth word line couples a gate of the third transistor to the row decoder;

in the case of writing the one-bit data to the first memory cell transistor in the first mode, the row decoder applies the first voltage to the fifth word line; and in the case of writing the two-bit data to the first memory cell transistor in the second mode, the row decoder applies the second voltage to the fifth word line.

17. The memory system according to claim 16, wherein:

the third transistor is a dummy memory cell transistor.

18. The memory system according to claim 11, further comprising:

a source line driver;

a sense amplifier;

a source line coupling the source line driver to the first selection transistor; and a bit line coupling the sense amplifier to the second selection transistor.

19. The memory system according to claim 11, wherein:

the first transistor is a dummy memory cell transistor.

20. The memory system according to claim 11, wherein:

in the write operation, data is stored in the first memory cell transistor and no data is stored in the first transistor.

* * * * *